US005920510A

United States Patent [19]

Yukutake et al.

[11] Patent Number: 5,920,510
[45] Date of Patent: Jul. 6, 1999

[54] SEMICONDUCTOR DEVICE CAPABLE OF HOLDING SIGNALS INDEPENDENT OF THE PULSE WIDTH OF AN EXTERNAL CLOCK AND A COMPUTER SYSTEM INCLUDING THE SEMICONDUCTOR DEVICE

[75] Inventors: Seigou Yukutake, Kodaira; Takashi Akioka, Akishima; Kinya Mitsumoto, Tamamura-machi; Takahiro Nagano, Higashi-murayama; Hideo Maejima, Hitachi., all of Japan

[73] Assignee: Hitachi, Ltd., Tokyo, Japan

[21] Appl. No.: 08/934,202

[22] Filed: Sep. 19, 1997

[30] Foreign Application Priority Data

Sep. 20, 1996 [JP] Japan .................................. 8-250130

[51] Int. Cl.⁶ .................................................. G11C 16/04
[52] U.S. Cl. .................... 365/189.05; 365/194; 365/233; 365/230.08
[58] Field of Search .............................. 365/189.05, 233, 365/230.08, 194, 191

[56] References Cited

U.S. PATENT DOCUMENTS

| | | | |
|---|---|---|---|
| 4,996,672 | 2/1991 | Kim | 365/225.7 |
| 5,124,669 | 6/1992 | Palmer et al. | 331/1 A |
| 5,446,867 | 8/1995 | Young et al. | 395/550 |
| 5,566,108 | 10/1996 | Kitamura | 365/233 |
| 5,619,170 | 4/1997 | Nakamura | 331/1 A |
| 5,621,698 | 4/1997 | Lee | 365/233 |
| 5,708,622 | 1/1998 | Ohtani et al. | 365/233 |
| 5,717,652 | 2/1998 | Ooishi | 365/233 |
| 5,729,500 | 3/1998 | Shinozaki | 365/230.01 |
| 5,740,115 | 4/1998 | Ishibashi et al. | 365/203 |
| 5,754,838 | 5/1998 | Shibata et al. | 395/559 |

FOREIGN PATENT DOCUMENTS

| | | |
|---|---|---|
| 6-20479 | 1/1994 | Japan . |
| 6-67670 | 3/1994 | Japan . |

OTHER PUBLICATIONS

T. Saeki et al "A 2.5ns Clock Access 250MHz 256Mb SDRAM with a Synchronous Mirror Delay", 1996 IEEE International Solid–State Circuits Conference, Session 23, Paper SP:23.4, pp. 300, 301, 374 and 375.

T. Saeki et al, "A 2.5ns Clock Access, 250–MHz, 256–Mb SDRAM with Synchronous Mirror Delay", IEEE Journal of Solid–State Circuits, vol. 31, No. 11, Nov. 1996, pp. 1656–1665.

*Primary Examiner*—David Nelms
*Assistant Examiner*—Tuan T. Nguyen
*Attorney, Agent, or Firm*—Fay, Sharpe, Beall, Fagan, Minnich & McKee

[57] ABSTRACT

A semiconductor device and a computer system, incorporating the same, is capable of capturing an external signal at a high speed and stably operating independent of the duty ratio of a clock signal. An external signal ADD is captured into an address latch 22 by a level latch. The level latch is controlled to a through state at the timing in which the external signal is decided and controlled to a latched state in the decision period of the external signal. A pulse generation circuit controls the timing for switching a latch to the through state to a desired timing by a pulse generation circuit 30 in a chip. According to the above structure, the capture of the external signal ADD can be accelerated because the capture of the signal is determined by the setup timing. Moreover, because a latching period is controlled by the pulse generation circuit in the chip, operations are performed in a stable manner without having to depend upon the pulse width of an external clock CLK.

34 Claims, 19 Drawing Sheets

$tvw = tw + tm1 + tm2 + tdr - tdf$ $tvR = tl1 + th1 + tdr - tdf$

SEMICONDUCTOR DEVICE CAPABLE OF HOLDING SIGNALS INDEPENDENT OF THE PULSE WIDTH OF AN EXTERNAL CLOCK AND A COMPUTER SYSTEM INCLUDING THE SEMICONDUCTOR DEVICE

FIELD OF THE INVENTION

The present invention relates to a synchronous semiconductor device whose operation is controlled in accordance with a clock signal. In particular, the present invention relates to a semiconductor device capable of performing stable operations at a high speed and a computer system including the semiconductor device as a component.

BACKGROUND OF THE INVENTION

In the case of a conventional synchronous random access memory (SRAM), a register control type is frequently used which captures a signal such as an address incoming from an external unit outside of the chip at the leading edge of a clock. For example, the official gazette of Japanese Patent Laid-Open No. 20479/1994 discloses controlling input/output of a signal at the leading edge of a clock. A conventional example of capturing an address signal by the register control type is described below in conjunction with FIGS. 14(a) and 14(b). In FIGS. 14(a) and 14(b), an address signal ADD incoming from an external unit outside of the chip is input with a setup time (ts) and a hold time (th) for the leading edge of a clock signal CLK. Therefore, the decision period of the address signal incoming from an external unit outside of the chip is shown by the following expression.

$$\text{Signal decision period} = \text{Setup time (ts)} + \text{Hold time (th)} \quad (1)$$

The address signal ADD is delayed by a circuit or wiring and is input to an address register 23 through an address buffer 21, or the like. The address register 23 is controlled by a control clock CLK' so as to securely capture a desired address signal "A0" at the middle of the decision period of an address signal a1 input to the address register 23. An output of the address register 23 serving as an internal address signal ADD' is output at the timing of t0 delayed by a delay time from the leading edge of the control clock CLK' by the address register 23.

A conventional register control system captures an address signal at the leading edge of a clock. To securely capture a desired address signal, the timing of a control clock is set so as to capture the address signal at the middle of an address-signal decision period. Therefore, the address signal is captured by an address register by being delayed from the timing in which the address signal is decided. This delay corresponds to a time approx. ½ the address signal decision period. Thus, because an address signal captured into a chip is determined in accordance with an address register control clock, the address signal is delayed by a time approximately equal to half the address signal decision period from the timing in which an address is decided.

In order to shorten the access time and cycle time of an SRAM, it is necessary to capture an address signal into a chip simultaneously with the timing in which the address signal is decided. However, a register for capturing a signal at the leading edge of a clock cannot securely capture desired data because there is no setup margin for capturing the signal.

A latch control type using a level latch is used as a means for determining the capture of an address signal into a chip in accordance with the timing in which the address signal is decided. For example, the official gazette of Japanese Patent Laid-Open No. 67670/1994 discloses an art for latching period signals linked by a clock in the period of "Hi".

SUMMARY OF THE INVENTION

The present inventors have recognized the problems in the above-mentioned prior art methods and devices. For example, a conventional example of capturing an address signal by the latch control type is described below in conjunction with FIGS. 15(a) and 15(b). The signal capturing method by the conventional latch control type controls the period (tKH) between the rise timing (t1r) of a clock CLK and the fall timing (t1f) of the clock to a latched state and the period (tKL) between the fall timing (t1f) of the clock and the rise timing (t2r) to a through state. Therefore, because a latching period is linked with (tKH) of the clock, a problem occurs that the latching period, that is, the decision period of the internal address ADD' is shortened when (tKH) of the clock is shortened and as a result neither read nor write operations can be performed.

In order to solve this problem and others, an object of the present invention is to provide a synchronously-operating semiconductor device for accelerating the capture of an external signal and stably performing operations independent of the duty ratio of a clock signal.

To achieve this object, a holding-period control signal generation circuit (pulse generation circuit) is provided that is capable of optionally controlling the periods for holding an input signal and output signal independently of the pulse width of an external clock signal so as to hold the signals for a period necessary for the normal internal operation or output signal holding. Moreover, the holding-period control signal has a signal holding period longer than that of a one-shot pulse signal generated from the leading edge of an external clock signal when the pulse width of the external clock signal decreases, by taking the logical sum between the external clock signal and the one-shot pulse signal.

Furthermore, to obtain a signal holding period that isn't at all influenced by the pulse width of an external clock signal, the signal holding period is controlled by a one-shot pulse signal generated from the leading edge of the external clock signal.

Additionally, to control a latching period by a duty ratio for an operation cycle time, a PLL is used for the holding-period control signal generation circuit (pulse generation circuit).

To control a latching period during the period from the timing of the leading edge of an external clock up to the timing for the leading edge of the next cycle and to control the latching period by a relative time for the leading edge of the clock, a DLL is used for the holding-period control signal generation circuit (pulse generation circuit).

Also, means for adjusting a holding-period control signal by a program circuit or fuse circuit is used so that the latching period can be adjusted after a chip is completed.

In order to control the dispersion between holding-period control signals, a delay circuit constituted with a current switch of an ECL or a gate delay circuit to be driven by a constant current is used for a delay circuit and the like in the holding-period control signal generation circuit.

According to the present invention, a signal holding means is provided with a two-stage holding means of a master latch and a slave latch so as to control the signal holding means by only the leading edge of an external clock and accelerate the capture of a signal into the signal holding means. Furthermore, means is used for making the slave-latch control timing 10% of an operation cycle time or more earlier than the master latch control timing.

Finally, the present invention employs the semiconductor device described above in a high-speed computer system.

DETAILED DESCRIPTION OF THE PREFERRED EMBODIMENTS

The preferred embodiments of the present invention are described below in conjunction with the accompanying drawings.

Figure 1A:
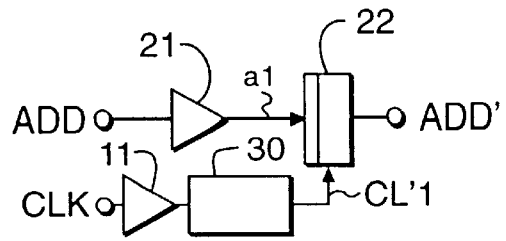
FIGS. 1(a) and 1(b) are a block diagram and a timing diagram illustrating signal capturing means of the present invention.
Figure 1B:
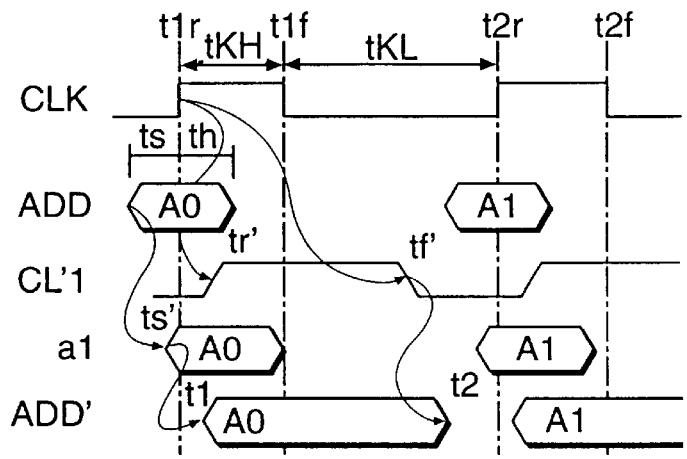

FIGS. 1(a) and 1(b) are a block diagram and a timing diagram showing an embodiment of signal capturing means of the present invention. A clock signal input CLK is input to a pulse generation circuit 30 through a clock buffer 11. The address signal ADD is input to an address latch 22 either through the address buffer 21 or directly. The address latch 22 is controlled in accordance with an address latch control clock signal CL'1 which is an output of the pulse generation circuit 30 and outputs a captured signal as the internal address signal ADD'.

Operations are described below by referring to the timing diagram in FIG. 1(b). The clock signal CLK rises at the time t1r and falls at the time t1f. The pulse generation circuit 30 generates a one-shot-pulse address latch control clock signal CL'1 from the leading edge of the clock signal CLK input through the clock buffer 11 to control the address latch 22 by the signal CL'1. The clock signal CL'1 controls the address latch 22 so as to be set to the through state at "Lo" and the latched state at "Hi".

The address signal ADD is input from an external unit outside of the chip because the address "A0" has a setup time ts and a hold time th for the time t1r. The address "A0" is input to the address latch 22 at the timing of the signal a1 delayed due to the address buffer 21, and the like, or wiring. At the point of time ts' when the address "A0" is decided as an address signal input of the address latch 22, the control clock signal CL'1 is set to "Lo" and the address latch 22 is controlled to the through state. Therefore, the address "A0" is delayed by the delay of the address latch 22 and output as the internal address signal ADD'. For the internal address signal ADD', the address "A0" is decided at the point of time t1. The control clock signal CL'1 is set to "Hi" at the timing of tr' to control the address latch 22 to the latched state. At this point of time, the address "A0" is held by the address input a1 of the address latch 22. Therefore, the address "A0" is latched by the address latch 22 for the period between tr' and tf'. Thus, the address "A0" is held as the internal address signal ADD' for the period between t1 and t2.

In this embodiment, because the internal address signal ADD' is decided according to the delay from the setup time of the address input signal ADD, it is possible to accelerate the internal address ADD'. Moreover, because an internal address decision period is determined by a pulse width in a pulse generation circuit without depending on the pulse widths (tKH and tKL) of a clock input signal, it is possible to set a desired internal address decision period.

Figure 2:
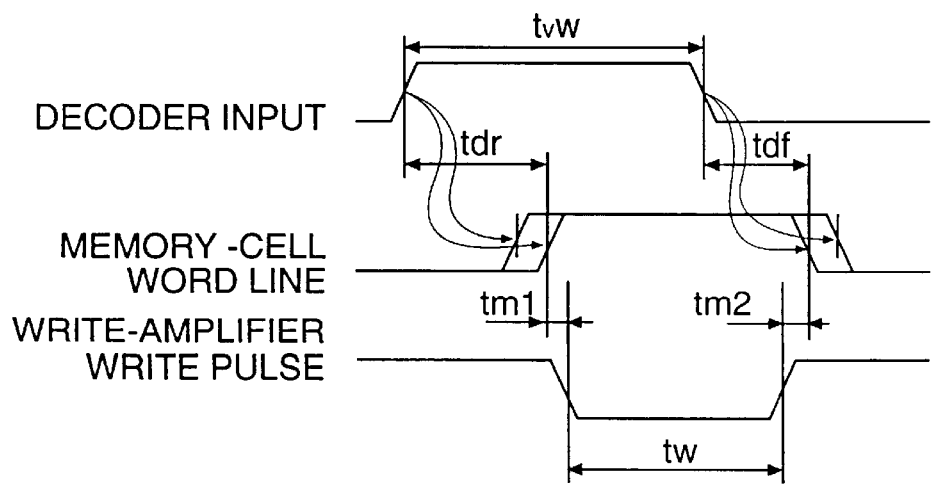
FIG. 2 illustrates the decision period of a decoder input signal necessary for the normal write operation.

A decoder-input-signal (internal address signal) decision period necessary for write and read operations is described below by referring to FIGS. 2 and 3. FIG. 2 is an illustration showing a decoder-input-signal decision period necessary for a normal write operation. In an SRAM, data is written in a memory cell by setting either of a pair of bit lines connected to the memory cell to "Lo" level. The bit line is set to the "Lo" level by a write amplifier. A pulse set to "Lo" level for writing data in the memory cell is referred to as a write pulse and the minimum pulse width required for normal write in the memory cell is assumed as tw.

To prevent erroneous writing (e.g. writing of data in a place other than a write cell), it is ideal that a word line section period includes a period in which a data line is set to "Lo" level by a write pulse. Therefore, a word line is designed with margins (tm1 and tm2) for deciding the word line before the start of a write pulse and holding it up to after the end of the write pulse. The word line selection period is determined by the decision time of a decoder input. A word line is decided by the delay time tdr of a decoder latest from the decision of the decoder input and becomes undecided by the earliest delay time tdf of the decoder after the decoder input becomes undecided. Therefore, the decision period tvW of a decoder input signal is shown by the following expression.

$$tvW=tw+tm1+tm2+tdr-tdf$$

Therefore, to perform the write operation normally, the minimum decoder-input-signal decision period tvw is necessary as described above.

Figure 3:
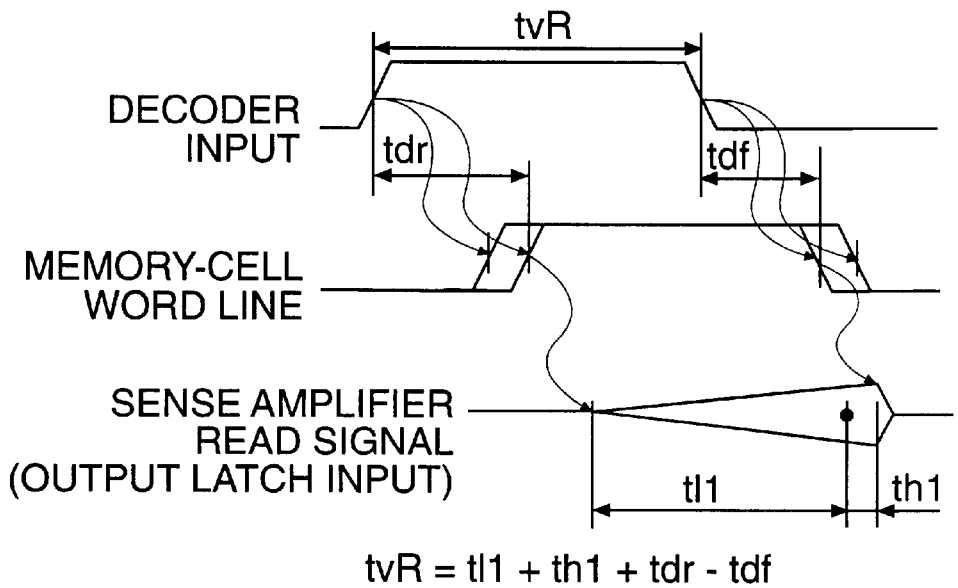
FIG. 3 illustrates the decision period of a decoder input signal necessary for the normal read operation.

FIG. 3 illustrates the decision period of a decoder input signal necessary for the normal read operation. The decision period of a word line necessary for the read operation is obtained by adding a period t11 from the time when the word line is decided up to the time when a sense amplifier is latched after its amplitude is expanded from an equalized state to a hold time th1 necessary for the latching operation. The decision period of a word line is the same as in the case of write and the decision period tvR of a decoder input signal necessary for the read operation is shown by the following expression.

$$tvR=t11+th1+tdr-tdf$$

Therefore, to normally perform the read operation, the minimum decoder-input-signal decision period tvr is necessary as described above.

Accordingly, when using a level latch for the capture of an address signal, or the like, and controlling a latching period linked with a conventional external-clock width, normal operation cannot be performed due to the acceleration of an operation cycle or the duty ratio of a clock. Therefore, it is necessary to control the latching period to a desired value.

Embodiment 2

Figure 4:
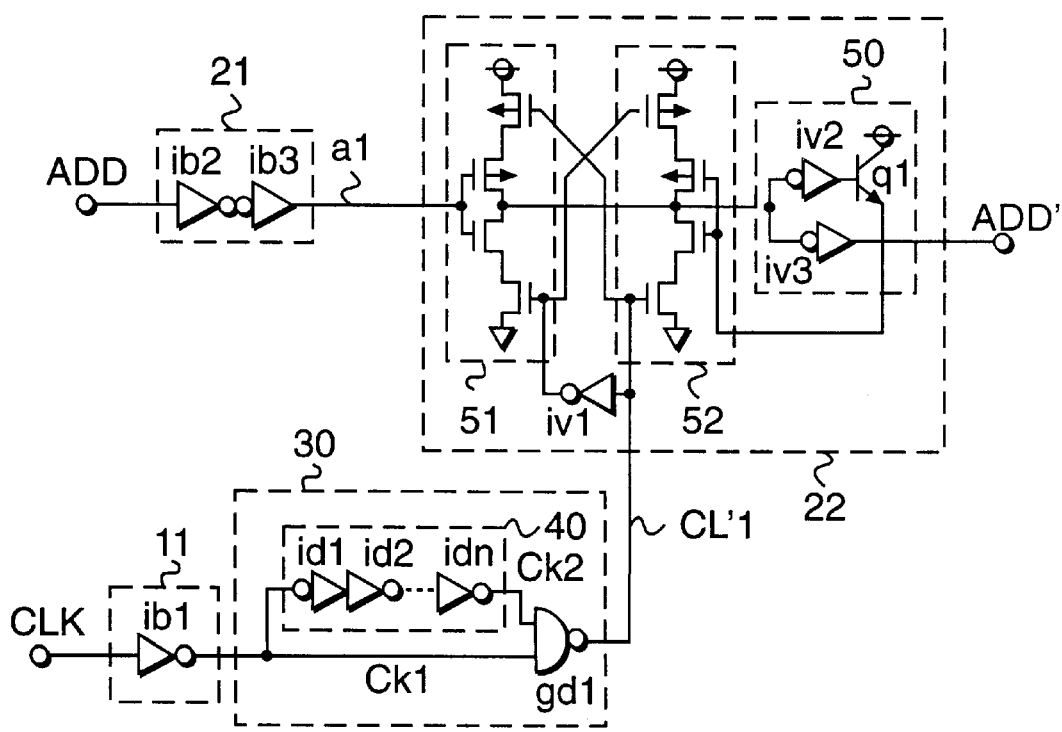
FIG. 4 shows an embodiment of signal capturing means of the present invention.

FIG. 4 is a circuit diagram of an embodiment obtained by specifically replacing the block diagram in FIG. 1 which is signal capture control means of the present invention with a circuit. The address buffer 21 includes inverters ib2 and ib3. The address latch 22 includes an inverter iv1 for reversing a clock signal, a clocked inverter 51 for a through state, a clocked inverter 52 for latching, and a BiNMOS inverter 50 for load driving. Moreover, the pulse generation circuit 30 comprises a delay circuit 40 including inverters (id1, id2, . . . , and idn) of even number stages and a NAND gate gd1.

Operations of a pulse generation circuit for controlling the address latch 22 are described below. A clock signal Ck1 which is an output of the clock buffer 11 is input to the pulse generation circuit 30. The clock signal Ck1 and a clock signal Ck2 obtained by delaying the clock signal Ck1 by the delay circuit 40 are input to a NAND gate gd1. A "Hi"-level one-shot pulse signal is generated in the output of the NAND gate gd1 during the period between the trailing edge of the clock signal Ck1 and the leading edge of the output Ck2 of the delay circuit 40. The pulse width of the one-shot pulse signal makes it possible to provide the "Hi"-level period of the clock input CLK by the delay time of the delay circuit 40. Therefore, even if the "Hi"-level period of the clock input CLK is shortened, it is possible to lengthen a latching period by the delay time of the delay circuit 40.

Figure 5:
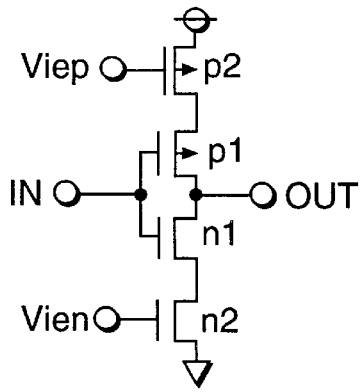
FIG. 5 illustrates an inverter for controlling the dispersion between delay times.

FIG. 5 shows an embodiment of an inverter used for a delay stage. Because the dispersion between pulse widths for latch control is determined by the dispersion between delay times of a delay circuit, it is effective to use a constant-current-driven inverter with a small dispersion between delay times. The inverter includes a pMOS(p2), pMOS(p1), nMOS(n1), and nMOS(n1) vertically stacked between a high-potential power supply and a low-potential power supply. A constant-current bias potential Viep of the pMOS is applied to the gate of the pMOS(p2) and a constant-current bias potential Vien of the nMOS is applied to the gate of the nMOS(n2). The gate of the pMOS(p1) and that of the nMOS(n1) are connected in common to serve as an input terminal IN of the inverter. The drain of the pMOS(p1) and that of the nMOS(n1) which are a common node serve as an output node "OUT" of the inverter.

This embodiment makes it possible to provide a latching period necessary for normal operation because a one-shot pulse for controlling the latching period can be extended in stages of the inverter of the delay circuit. Moreover, it is possible to control the dispersion between latching periods by using an inverter in which the dispersion between delay times is controlled.

Embodiment 3

Figure 6A:
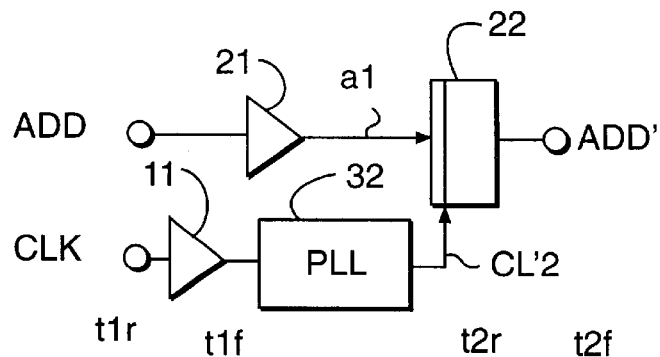
FIGS. 6(a) and 6(b) illustrate a signal input/output control circuit using a PLL and a related timing diagram.
Figure 6B:
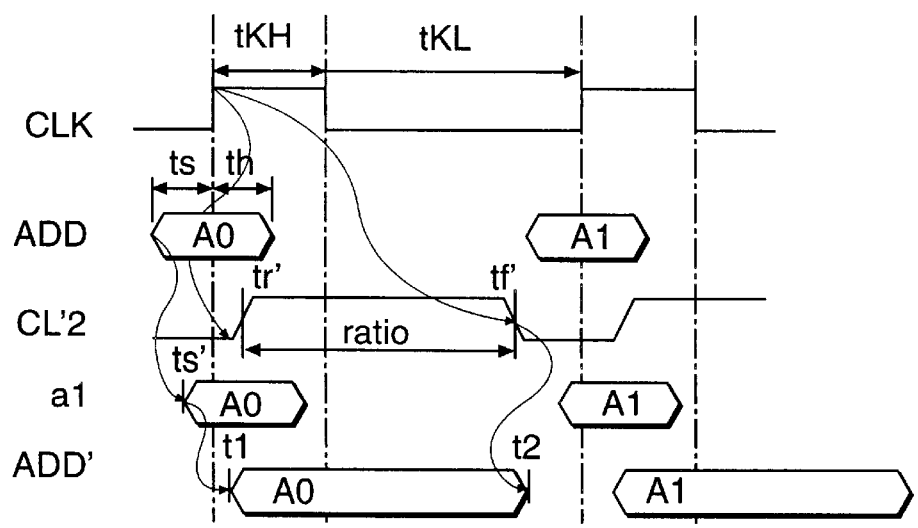

FIGS. 6(a) and 6(b) show a block diagram and a timing diagram of a signal input/output control circuit using a PLL for its pulse generation circuit. Embodiment 3 is the same as embodiment 1 except that a PLL (Phase-Locked Loop) is used for the pulse generation circuit. A PLL 32 inputs an external clock signal CLK through the clock buffer 11 to generate an internal-control clock signal CL'2 in accordance with the external clock signal CLK. A PLL can generate an internal clock pulse at a ratio to the cycle time of an external clock and moreover generate various internal clock signals as needed. In the case of an input/output control circuit using a level latch, it is possible to set the length (ratio to a cycle) of an internal-clock control signal CL'2 to a desired value even if tKH of the external clock signal CLK is shortened.

According to this embodiment, it is possible to adjust a latch control period to the time in which read and write operations are stabilized by adjusting the length of of an internal clock. Therefore, this embodiment stably operates even if the period of tKH of an external clock signal is shortened.

Embodiment 4

Figure 7A:
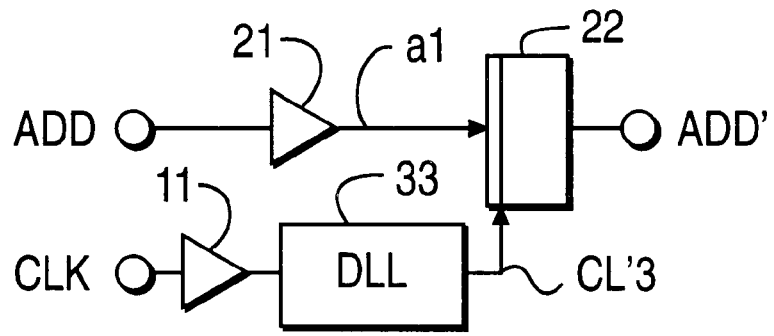
FIGS. 7(a) and 7(b) illustrate a signal input/output control circuit using a DLL and a related timing diagram.
Figure 7B:
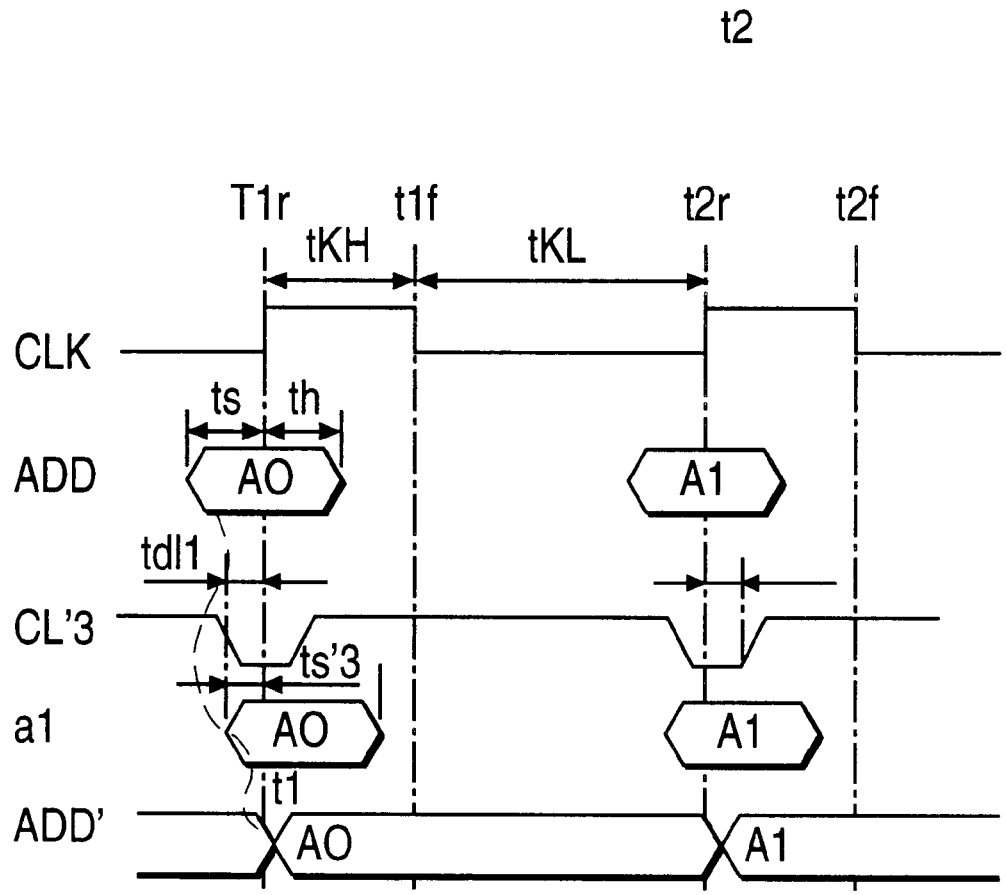

FIGS. 7(a) and 7(b) show a block diagram and a timing diagram of a signal input/output control circuit using a DLL for its pulse generation circuit. Embodiment 4 is the same as embodiment 1 except that the DLL (Delay-Locked Loop) is used for the pulse generation circuit. A DLL 33 inputs an external clock signal CLK through the clock buffer 11 to generate an internal control clock signal CL'3 in accordance with the external clock signal CLK. A DLL can control a delay time differently from the case of controlling a ratio to a cycle time in a PLL. Therefore, it is possible to generate an internal clock in a relative time to the edge of an external clock. By effectively using the above feature, it is possible to control the address latch 22 to a through state for the setup time of the address input signal a1 of the address latch 22 and moreover, perform latch control at the middle of the period in which the address signal a1 is decided. Therefore, it is possible to control a latched circuit without depending on the length of tKH of the external clock CLK. A latch control clock CL'3, which is an output of the DLL 33, controls the address latch 22 to a through state at its trailing edge and to a latched state at its leading edge. By equalizing the timing td11 for determining the control to the through state with the setup timing ts' 3 of an address-latch input signal, it is possible to decide an internal address at a high speed without outputting an undecided address to the output of an address latch.

Because this embodiment makes it possible to control a latched circuit to a through state for the setup time of an input/output signal, it is possible to latch a signal at a high speed, without capturing an undecided signal, independently of an operation cycle or the period of tKH of an external clock signal.

Embodiment 5

Figure 8:
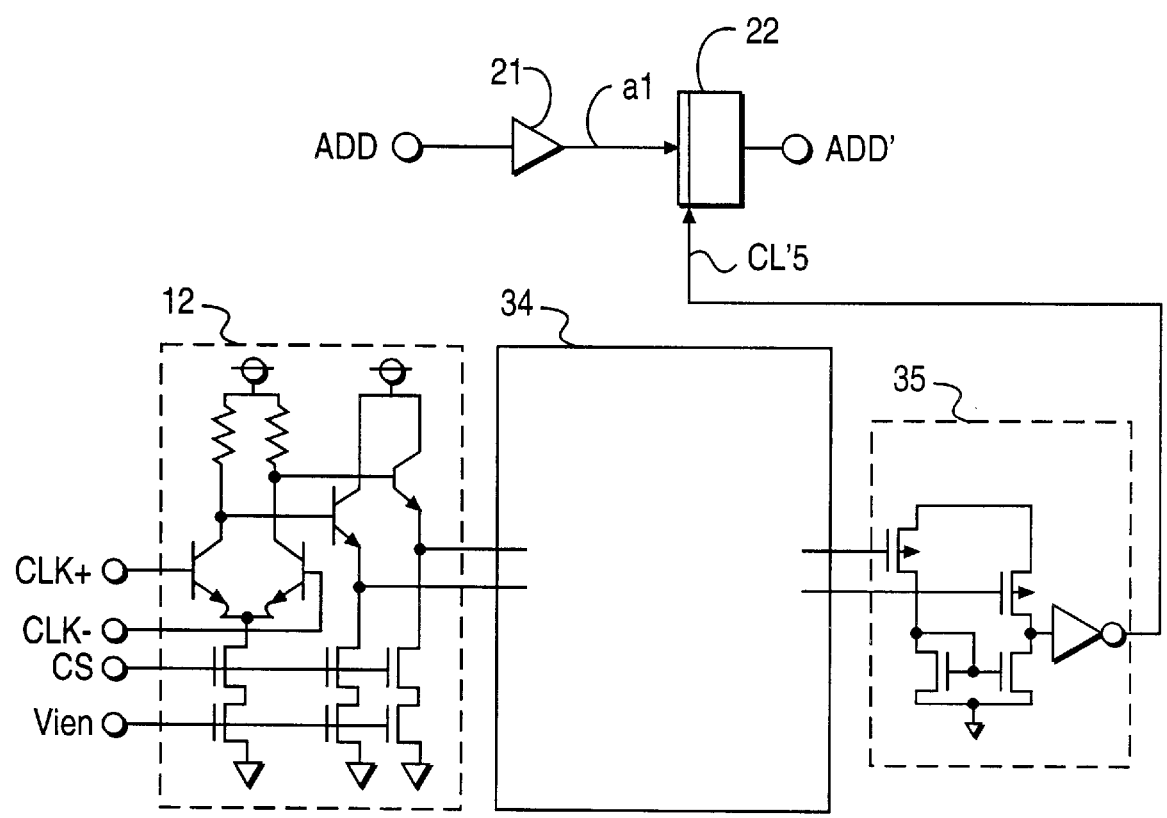
FIG. 8 illustrates an embodiment applied to an ECL clock signal.
Figure 9:
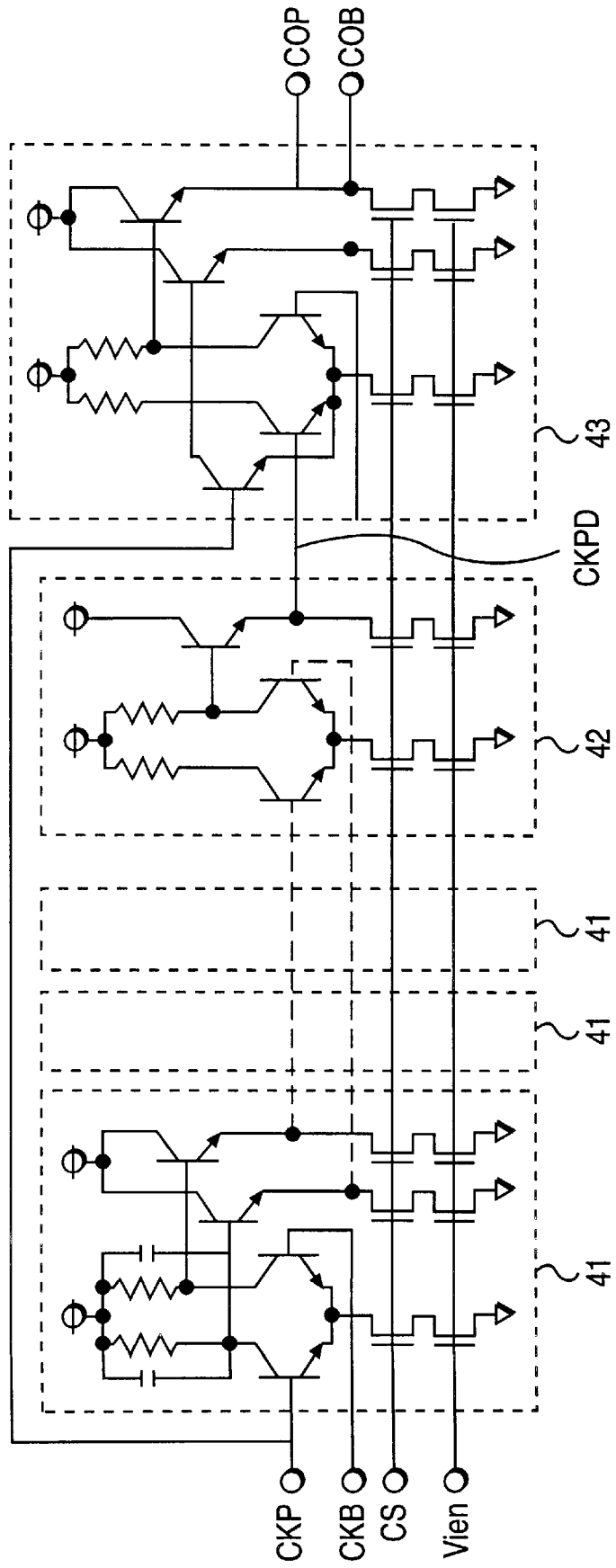
FIG. 9 illustrates a delay circuit comprising an ECL current switch.

Embodiments of an input/output control circuit and a pulse circuit of the present invention in accordance with an ECL clock signal are described below by referring to FIGS. 8 and 9. Symbol 12 denotes an ECL clock buffer circuit, 34 denotes a pulse generation circuit for generating a one-shot pulse by receiving an output of the ECL clock buffer 12, and 35 denotes a level conversion circuit for converting an ECL signal level into a CMOS level. ECL clock signals CLK+ and CLK– which are complementary signals are input to the ECL clock buffer 12, which includes an ECL current switch. Symbol Vien denotes a constant-current-control bias power supply and CS denotes a select signal for controlling operations of a circuit. The clock buffer 12 generates a desired internal amplitude by amplifying an ECL clock signal at a constant current and transmits the clock signal to the pulse generation circuit 34. The select signal CS is set to a low-potential power-supply level at the time of an inactive state and turns off the constant current to control it to a standby state. FIG. 9 shows a pulse generation circuit for the ECL signal of 34.

In FIG. 9, symbol 41 denotes a delay circuit comprising a current switch of an ECL. Symbol 42 denotes a delay circuit of the ECL, which uses a single end output because only a single end signal is used for an ECL-OR circuit at the rear stage. Symbol 43 denotes an OR circuit of the ECL, which outputs complementary outputs COP and COB of the OR logic between a positive output CKP of an ECL clock buffer and a positive signal CKPD of a clock delayed by the delay circuits 41 and 42 and converts an ECL level into a CMOS level by the level conversion circuit 35 in FIG. 8. In the case of this embodiment, it is possible to reduce the dispersion of occurrence of pulses due to a power supply voltage or temperature because the clock buffer 12 and the pulse generation circuit 34 respectively has an ECL structure to be driven by a constant current.

Embodiment 6

Figure 10A:
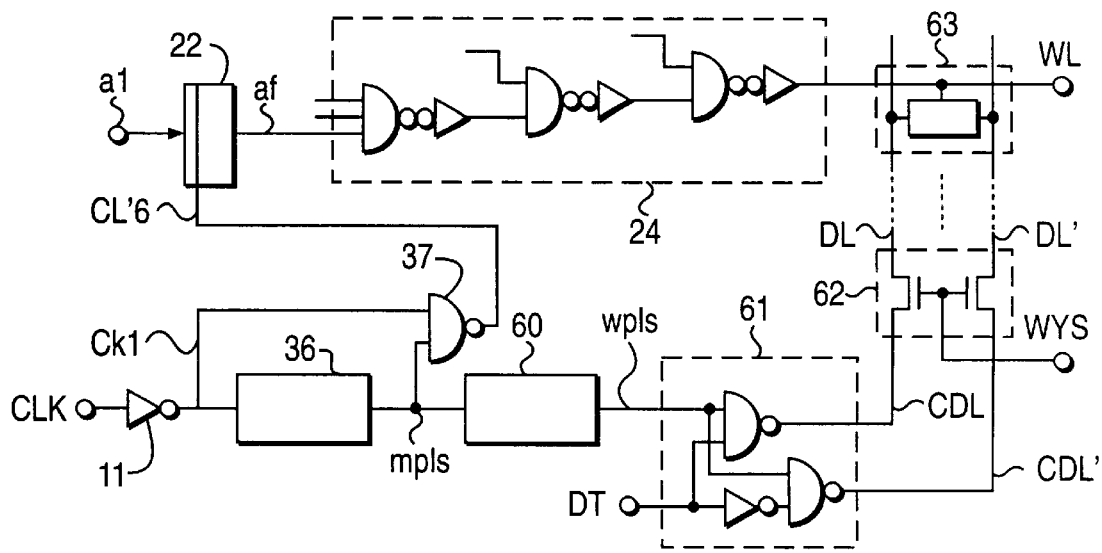
FIGS. 10(a) and 10(b) are a block diagram and a timing diagram of an embodiment for controlling a latching period by linking to a write pulse.
Figure 10B:
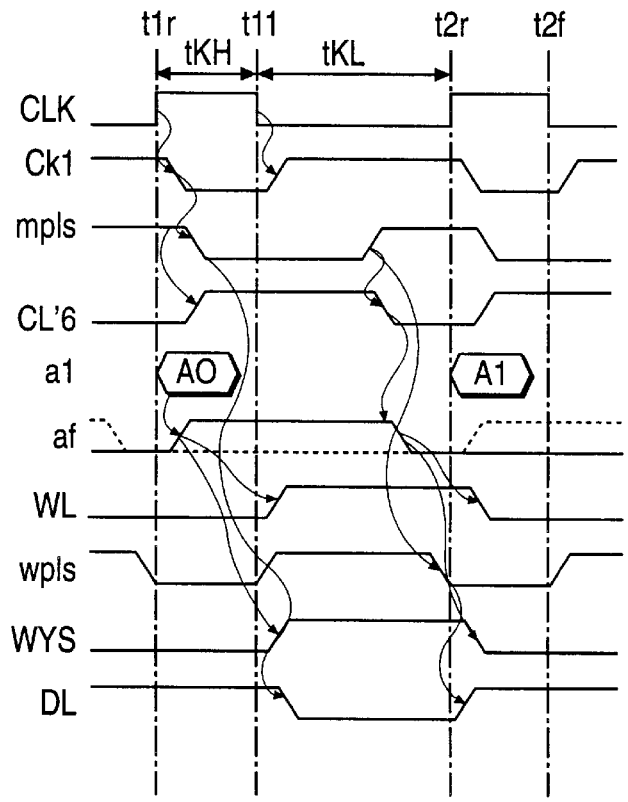

FIGS. 10(a) and 10(b) show an embodiment for controlling a latch control pulse by linking it with a write control pulse. Symbol 11 denotes a clock buffer which inputs an external clock signal CLK and outputs the clock buffer output signal Ck1. Symbol 36 denotes a basic pulse generation circuit which outputs a one-shot basic pulse mpls. Symbol 37 denotes a NAND circuit which computes the logic between the clock buffer output Ck1 and the output mpls of the basic pulse generation circuit 36 to control the address latch 22 in accordance with its output CL'6. Symbol af denotes an output of the address latch, which is input to a decoder circuit 24. Symbol WL denotes a word line to which data is output from a decoder. Symbol 63 denotes a memory cell to be selected by the word line WL, which outputs memory cell data to a data line pair DL and DL'. Symbol 62 denotes a write column selection switch which is controlled by a write column select signal WYS. Symbol 60 denotes a write control circuit which adjusts the timing with the selection timing of the word line and computes the logic with a select signal to supply a write pulse signal wpls to a desired write amplifier. Symbol 61 denotes a write amplifier which computes the logic between the write control pulse wpls and write data DT and sets either of common data lines CDL and CDL' to "Lo" level to write data in the memory cell.

Operations of this embodiment are described below by using the timing diagram in FIG. 10(b). The basic pulse mpls is generated by Ck1 as a one-shot pulse. "Hi" is output to the latch control clock CL'6 while either of Ck1 and mpls is set to "Lo". At the trailing edge of Ck1, CL'6 controls the address latch 22 to a latched state, and at the leading edge of mpls it controls the latch 22 to a through state. In response to the address input signal a1 of the address latch 22, the decoder input signal af appears delayed by the delay by the address latch 22 and the latch lasts until the trailing edge of the latch control signal CL'6. The word line WL receives the leading edge of the decoder input signal af and is decided at the latest delay time of the decoder 24 and receives the trailing edge of the decoder input signal af and is selected for the period until it becomes undecided at the earliest delay time of the decoder 24.

This embodiment operates when writing data in a memory cell. The logic between the basic pulse mpls and a select signal is computed and the write control pulse wpls whose timing is adjusted is input to the write amplifier 61. The write column switch 62 is controlled by the write column select signal WYS and turned on when the data line pair DL and DL' are selected in a write cycle to write data in the memory cell. Either of the data line pair DL and DL' is controlled to "Lo" level by the write amplifier 61 and data is written in the memory cell. The pulse width of the write amplifier 61 is determined by only the basic pulse mpls. A word line selection period is obtained by subtracting the difference between delay times of a decoder (latest delay time–earliest delay time) from a value obtained by adding the pulse width of the basic pulse mpls and the setup time of the address signal a1. By setting the setup time of the address signal a1 to a value larger than the delay time of the decoder, it is possible to complete the write operation for the memory cell by turning off a data line within the word line selection period.

Thus, because this embodiment makes it possible to control the decision time of an address by becoming interlocked with the write operation, it is possible to stably control the write operation without depending on the pulse width of a clock signal.

Embodiment 7

Figure 11:
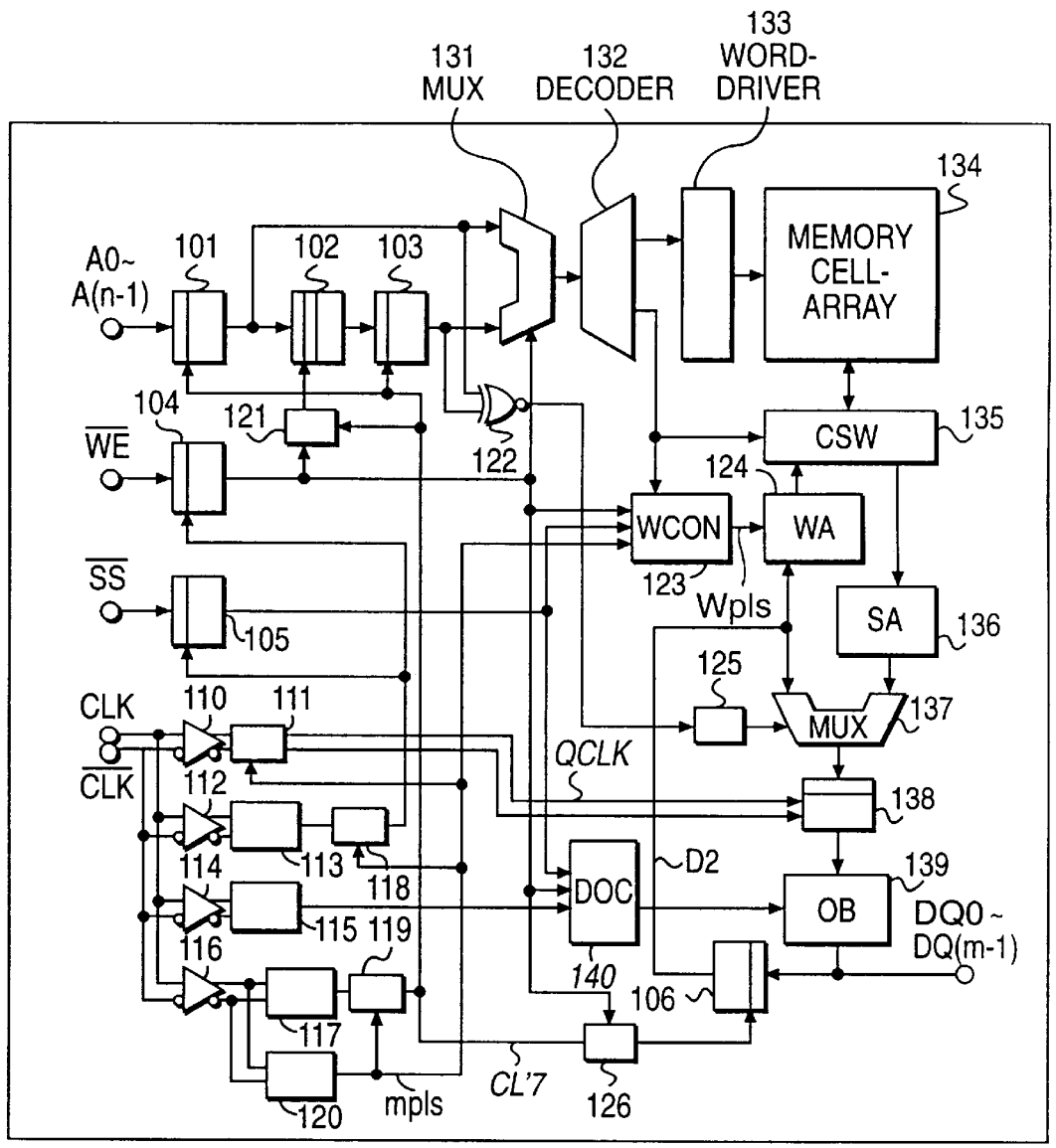
FIG. 11 is a block diagram of an SRAM using the present invention.

FIG. 11 shows a block diagram of an embodiment in which the present invention is applied to a synchronous SRAM. This embodiment is a synchronous SRAM having a late write function. Late write is characterized in that the write operation for a write address (memory cell) captured in a write cycle is executed in the next write cycle. Thereby, it is necessary to hold the write address and write data until the write operation is actually executed. Moreover, because there is no desired data in the write address (memory cell) for the period until data is written in the memory cell, it is necessary to read desired data from a latch (or register) holding the write data.

The structure and operations of this embodiment are described below by assuming a late write situation. Symbols A0 to A(n−1) denote address signals, WE denotes a write enable signal (hereafter referred to as WE), SS denotes a sync select signal, CLK denotes a clock signal, and DQO to DQ(m−1) denote input/output data.

A 1st address latch 101 captures an external address signal and outputs the captured address signal to a multiplexer (hereafter referred to as MUX) 131 and a middle address register 102. The middle address register 102 captures an address signal sent from the 1st address latch 101 only in a write cycle and outputs the signal to a 2nd address latch 103. Because of the above operation, the 2nd address latch 103 always receives write addresses and supplies the write addresses to the MUX 131. A middle-address-register 102 control signal generation circuit 121 realizes the control for supplying an address signal sent from the 1st address latch 101 to the middle address register 102 only in a write cycle by computing the logic between an address latch control clock CL'7 and a WE-based signal.

The MUX 131 selects a write address signal sent from the 2nd address latch 103 in a write cycle and a read address signal sent from the 1st address latch 101 in a read cycle in accordance with a WE-based signal to output the address signals to a decoder 132. According to the above address switching, it is possible to select an write address in a write cycle and a read address in a read cycle. A desired memory cell is selected from a memory cell array 134 by the decoder 132, a word driver 133, and a column switch 135.

The write operation for a memory cell is controlled by a write control circuit 123. The write amplifier 124 is controlled by a decode signal output by the decoder 132 and the write control pulse wpls controlled by a WE-based signal in accordance with the basic pulse mpls generated by a basic pulse generation circuit 120. The write amplifier 124 performs the write operation in accordance with the write control pulse wpls and write data D2 captured by a data input latch 106.

The read operation amplifies the data read out of the memory cell array 134 by a sense amplifier 136 through the column switch 135 and outputs the data to a MUX 137. The MUX 137 selects the data read out of a memory cell or write data held by the data latch 106 and therefore not written in a memory cell yet and outputs selected data to an output latch 138. An output of the output latch 138 is controlled by an output latch control clock QCLK and output to an output buffer 139. The output buffer 139 is controlled by the output control circuit 140 and outputs the data sent from the output latch 138 to an external unit outside of the chip. An address comparator 122 compares a read address and a write address for each address to judge whether the address is not written in a memory cell and the MUX 137 controls the selection of the data to be output by an output switching control circuit 125.

In the case of a clock-based signal, a clock buffer is used for each purpose in order to disperse and accelerate a clock-based load in the chip. An output latch control clock controls an output latch by a clock buffer 110 and a clock signal control-and-drive circuit 111. The basic pulse mpls signal is also supplied to the clock signal control-and-drive circuit 111 and therefore, it is possible to use the basic pulse mpls to control a latching period. A clock buffer 114 and a clock signal control-and-drive circuit 115 supply a clock for controlling the output control circuit 140. A clock buffer 112 and a clock signal control-and-drive circuit 113 are used to control a WE-based input and a clock buffer 116 and a clock signal control-and-drive circuit 117 are used to control an address input and a data input. Symbols 118 and 119 denote drive circuits each of which merges an internal clock signal interlocked with an external clock and the basic pulse mpls generated by the basic pulse generation circuit 120 and outputs a latch control signal for a write enable signal latch 104, sync select signal latch 105, and 1st address latch 101 and 2nd address latch 103.

Because this embodiment uses the latching-means control system described in the embodiment 1 downward in detail to capture an input signal and control an output latch, it is possible to accelerate an access and an operation cycle.

Embodiment 8

Figure 12:
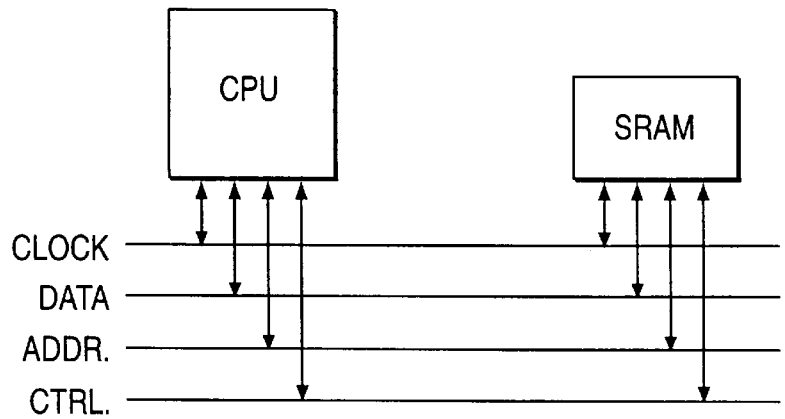
FIG. 12 is a block diagram of a system comprising a processor and an SRAM chip.

FIG. 12 shows a part of a system using an SRAM provided with input/output control means of the present invention for a secondary cache. This embodiment is a part of a system realized by connecting a processor chip CPU with an SRAM operating at a high speed according to the present invention by a clock signal Clock, data bus Data, address bus Addr., and control signal bus Ctrl.

This embodiment makes it possible to accelerate a system by using an SRAM capable of operating at a high speed for a secondary cache. Moreover, it is possible to realize further increases in speed by lengthening the setup times of a control signal, address signal, and data supplied from the processor chip CPU or the like to the SRAM.

Embodiment 9

Figure 13:
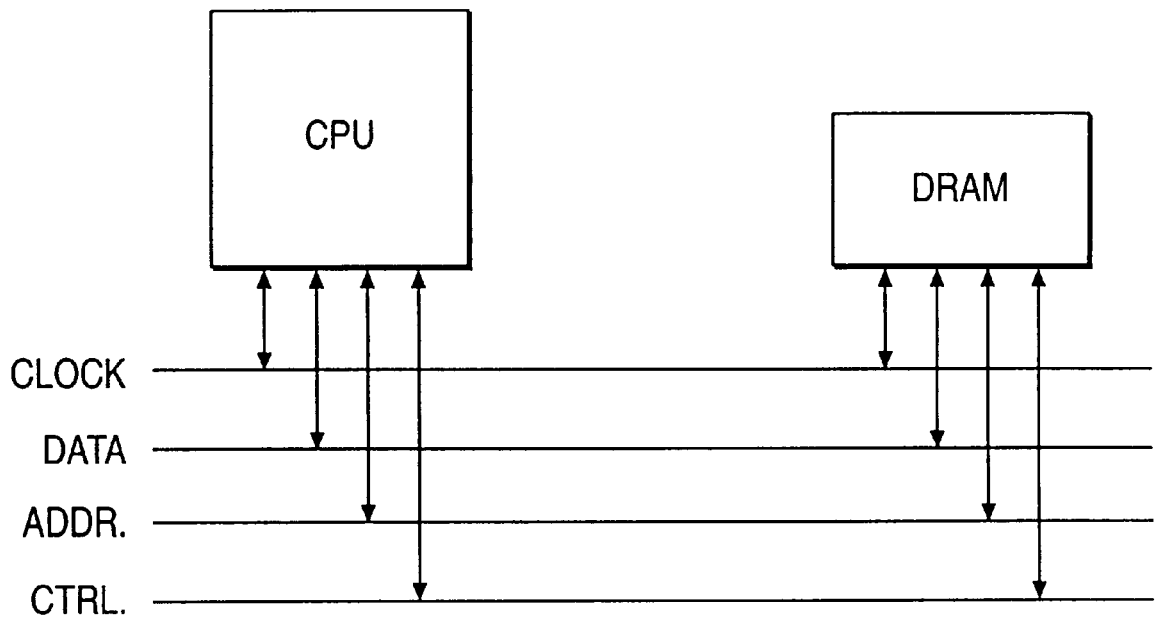
FIG. 13 is a block diagram of a system comprising a processor and a DRAM chip.
Figure 14A:
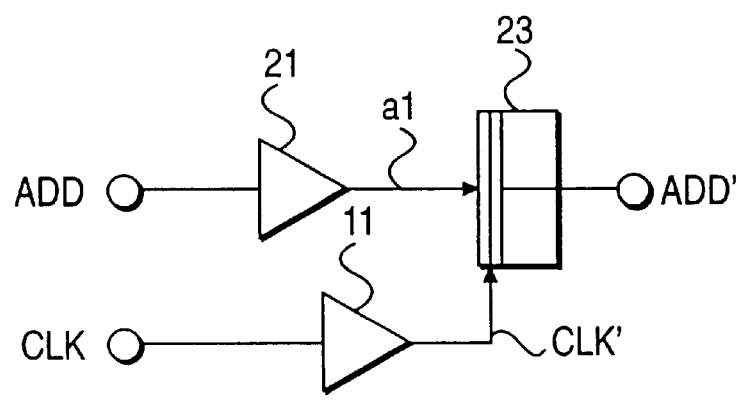
FIGS. 14(a) and 14(b) are a block diagram and a timing diagram for an output control circuit using a conventional register control system.
Figure 14B:
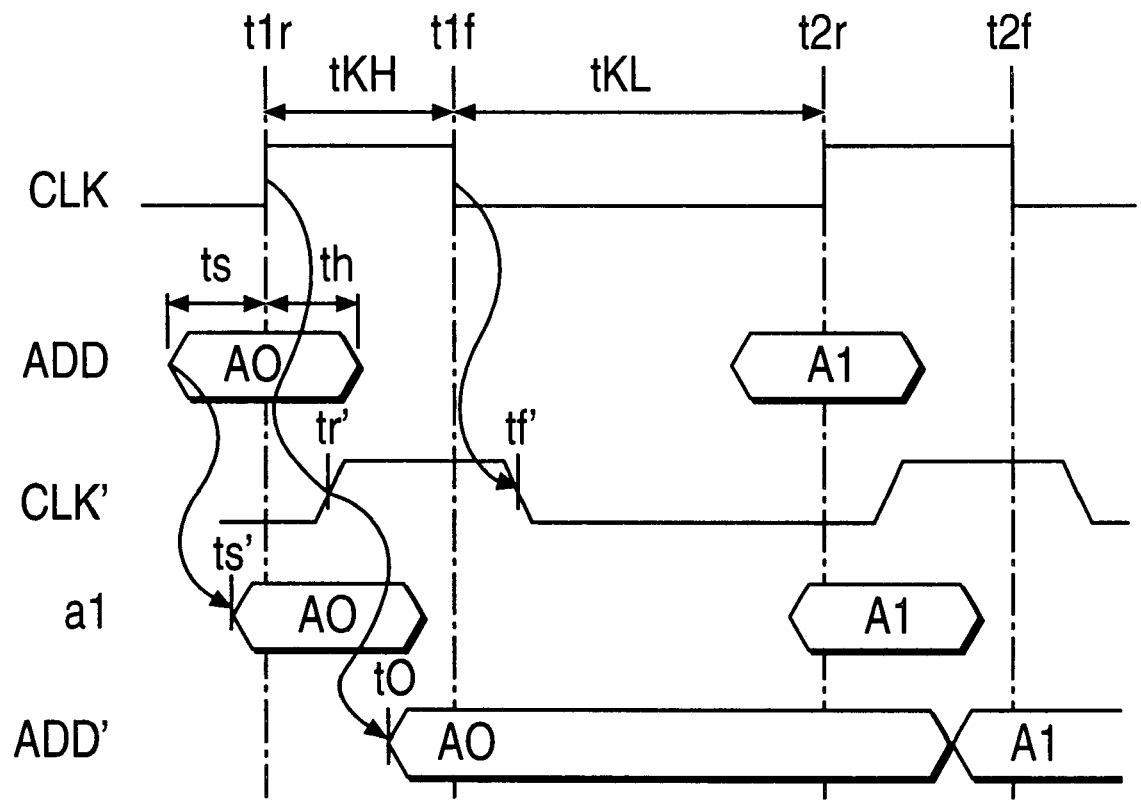
Figure 15A:
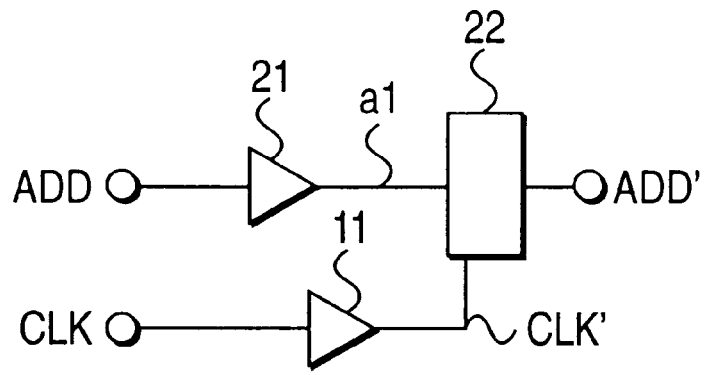
FIGS. 15(a) and 15(b) are a block diagram and a timing diagram of an output control circuit using a conventional latch control system.
Figure 15B:
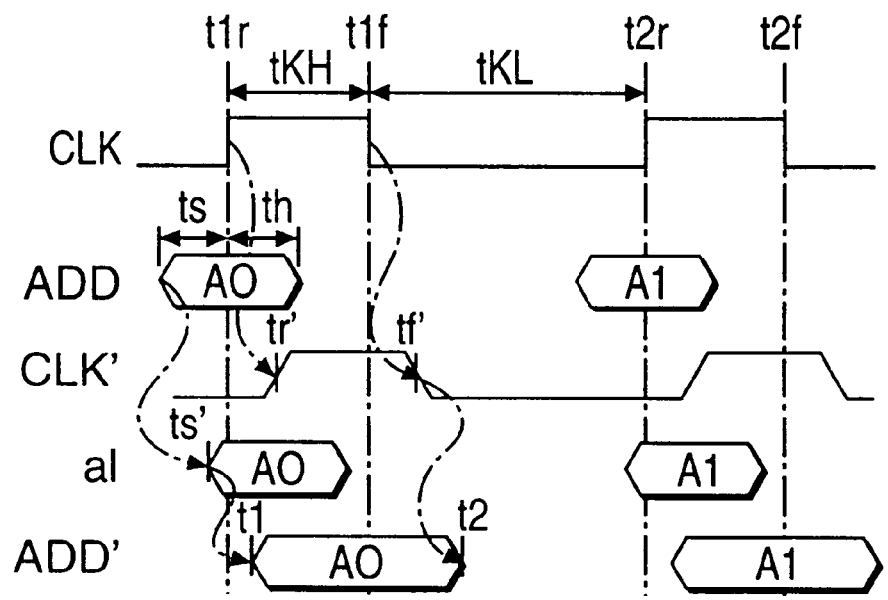

FIG. 13 shows a part of a system using a DRAM provided with input/output control means of the present invention. This embodiment is a part of a system realized by connecting a processor chip CPU with a DRAM operating at a high speed by a clock signal Clock, data bus Data, address bus Addr., and control signal bus Ctrl.

This embodiment makes it possible to accelerate the system by using a DRAM capable of operating at a high speed. Moreover, it is possible to realize further increases in speed by lengthening the setup times of a control signal, address signal, and data supplied from the processor chip CPU or the like to the DRAM.

Embodiment 10

Figure 16:
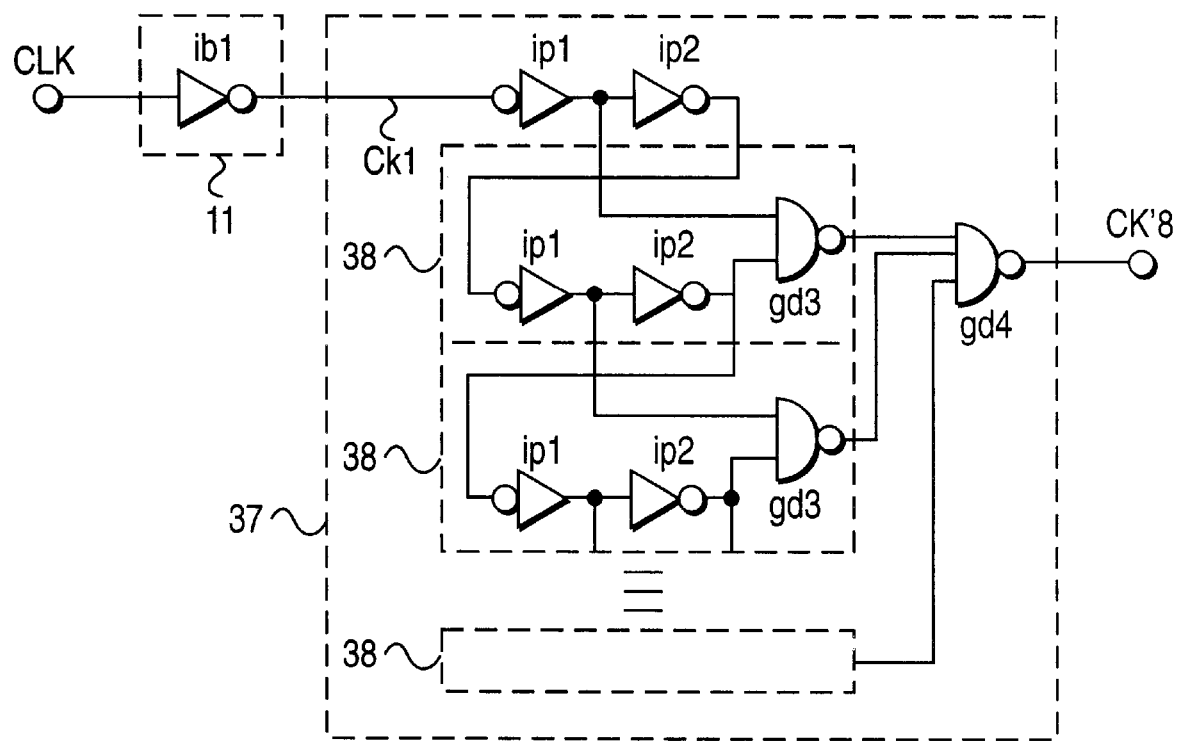
FIG. 16 is a block diagram of an embodiment of a pulse generation circuit used for a latching-period control signal generation circuit of the present invention.

FIG. 16 shows a block diagram of an embodiment of a pulse generation circuit used for a latching period control signal generation circuit of the present invention. The external clock signal CLK is input to the pulse generation circuit 37 through the clock buffer 11. Symbols ip1 and ip2 denote inverter circuits. Symbols gd3 and gd4 denote NAND circuits. Symbol 38 denotes one-shot pulse generation circuits in which overlapped pulses are generated from adjacent one-shot pulse generation circuits. The OR logic between the pulses generated by the one-shot pulse generation circuits 38 are received by the NAND circuit gd4 to generate a latch control pulse CL'8. A desired pulse width can easily be set in accordance with the number of set one-shot pulse generation circuits 38.

Although an inverter circuit and a NAND circuit in the pulse generation circuit 37 can be realized by a CMOS gate or an ECL gate, it should be understood that other equivalent devices can be used.

This embodiment makes it possible to set the latch control pulse CL'8 to a desired value independent of the pulse width of an external clock signal CLK in accordance with the number of one-shot pulse generation circuits 38 set in the pulse generation circuit 37 and a circuit constant.

Embodiment 11

Figure 17:
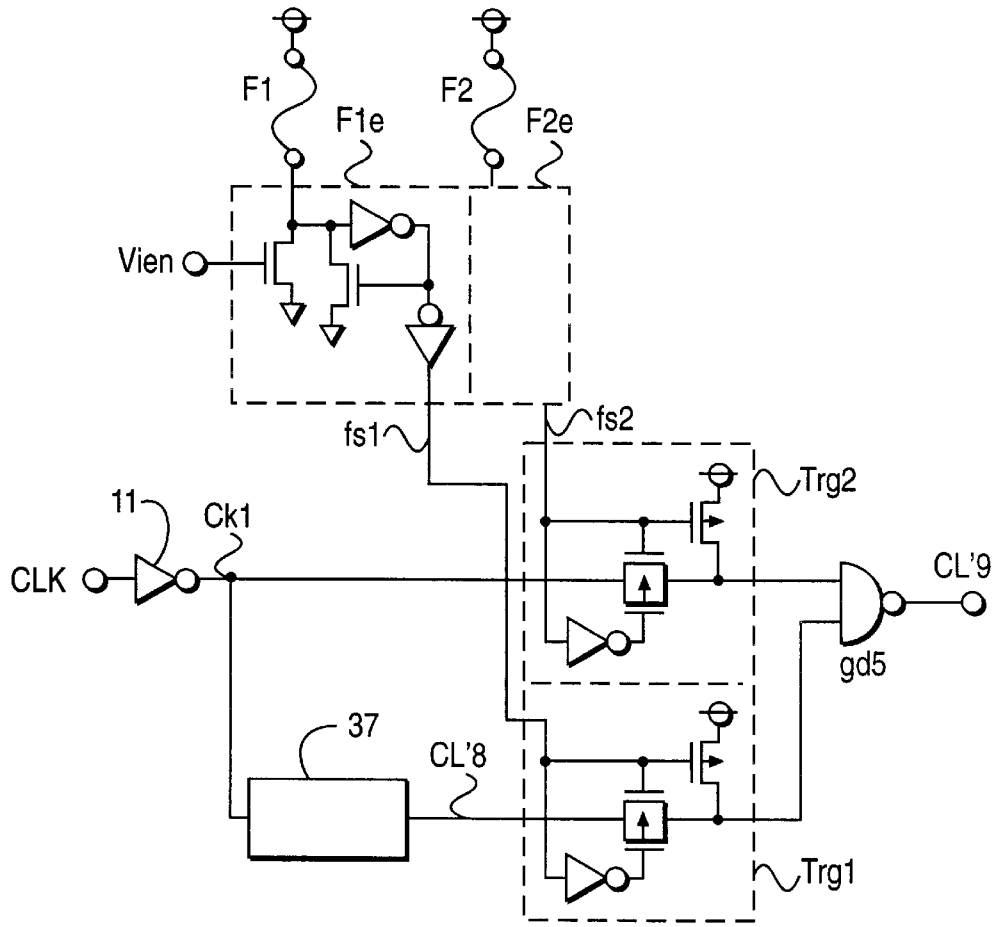
FIG. 17 is a circuit diagram of an embodiment of pulse synthesizing and switching means for generating a latch control pulse.

FIG. 17 shows an embodiment of a pulse synthesizing and switching means for generating a latch control pulse. In FIG. 17, symbols F1 and F2 denote fuses, F1e and F2e denote fuse signal stabilization circuits, and fs1 and fs2 are fuse circuit output signals each of which shows whether fuse F1 or F2 is turned off. Symbols Trg1 and Trg2 are transfer gate circuits each of which controls whether to transfer a signal at the input stage to the rear state or fix the signal to a "Hi" level. Symbol gd5 denotes a NAND circuit for computing the logical sum between the output Ck1 of the clock buffer 11 and the output CL'8 of the pulse generation circuit 37 to generate a latch control signal CL'9. When a fuse is not turned off, the latch control signal CL'9 serves as a pulse obtained by merging the output Ck1 of the clock buffer 11 and the output CL'8 of the pulse generation circuit 37. When turning off the fuse F1, the latch control signal CL'9 serves as a pulse interlocked with only the output CK1 of the clock buffer 11. However, when turning off the fuse F2, the latch control signal CL'9 serves as a pulse interlocked with only the output CL'8 of the pulse generation circuit 37.

Therefore, this embodiment makes it possible to change the period of a pulse by switching fuses or the like and obtain a performance requested by the specification of a semiconductor integrated circuit arrangement.

Embodiment 12

Figure 18:
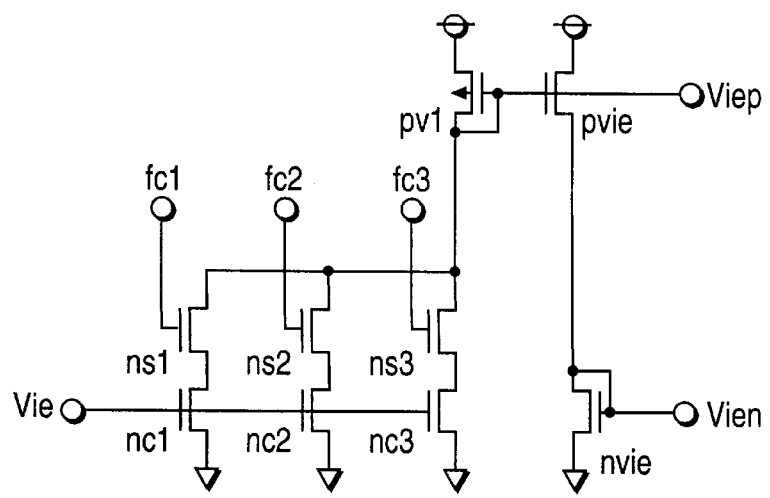
FIG. 18 is a circuit diagram of an embodiment of constant-current-bias switching means used for a delay circuit in a pulse generation circuit.

FIG. 18 shows an embodiment of a switching means of the constant-current bias used for a delay circuit in a pulse generation circuit. In FIG. 18, symbols nc1, nc2, and nc3 denote nMOS transistors, each of which uses a constant-current source, each of whose gates is connected to a constant-current-source nMOS control bias Vie, and each of whose sources is connected to a low-potential power supply. Gates of nMOS transistors ns1, ns2, and ns3 connect with control signals fc1, fc2, and fc3 respectively to turn on/off a constant current due to an nMOS using a constant current source. This constant current flows through a pMOS pv1 and a current mirror supplies a constant current according to the ratio of the current mirror to a pMOS pvie. The gate and drain of an nMOS nvie are connected to the drain of the pMOS pvie to generate the constant-current-source nMOS control bias Vien. It is possible to use not only a signal generated by the fuse circuit described in FIG. 17 but also an external control signal as the control signals fc1, fc2, and fc3 of the constant-current-bias switching means.

By using the constant-current-bias switching means of this embodiment, it is possible to easily control the delay time of a delay circuit, or the like. Therefore, it is possible to easily control a pulse width after testing a chip.

Embodiment 13

Figure 19A:
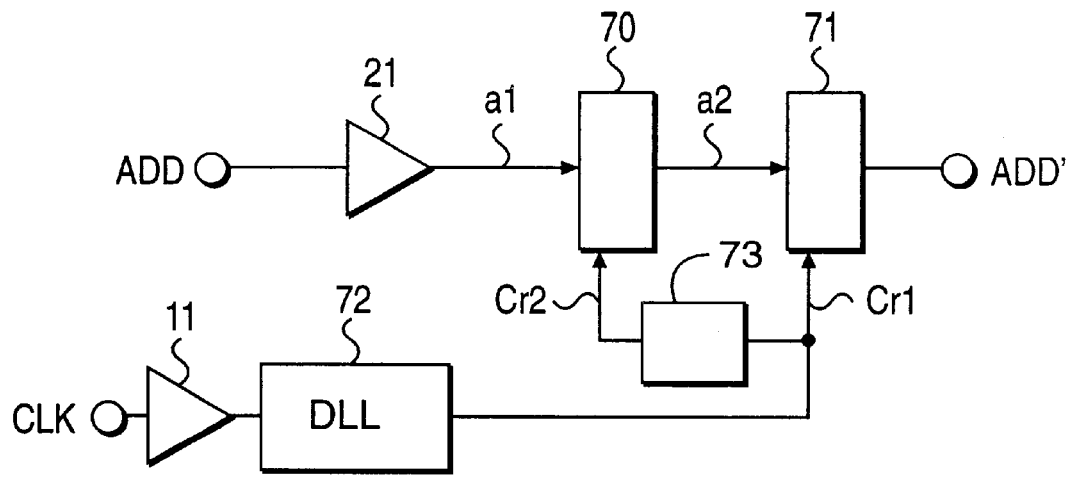
FIGS. 19(a) and 19(b) are a block diagram and a timing diagram of an embodiment using a register comprising a master latch and a slave latch for input/output signal latching means.
Figure 19B:
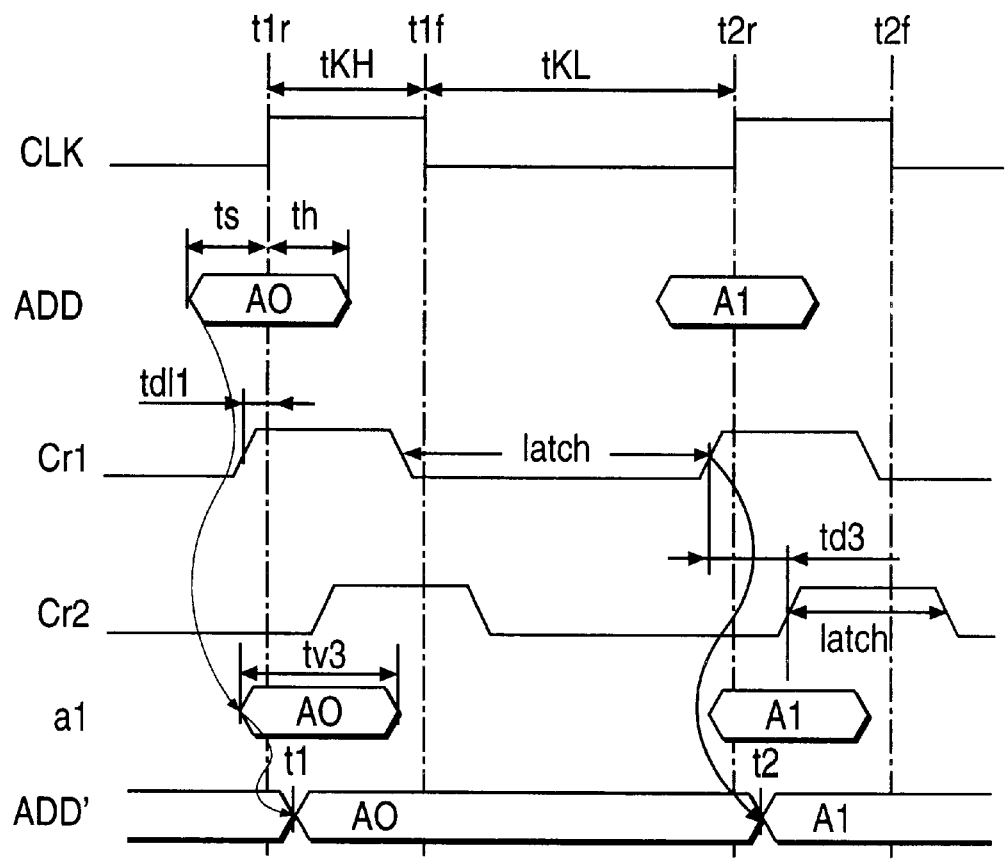

FIGS. 19(a) and 19(b) show a block diagram and a timing diagram of an embodiment using a register comprising a master latch and a slave latch of an input/output signal latching means. In FIG. 19(a), symbol 70 denotes a master latch and 71 denotes a slave latch, and both latches constitute a register. Master latch 70 is in a latched state when the latch control signal Cr2 is "Hi", and it is in a through state when the signal is "Lo". Slave latch 71 is in a through state when the latch control signal Cr1 is "Hi", and it is in a latched state when the signal is "Lo".

DLL 72 generates the control signal Cr1, which controls the slave latch 71. The Cr1 timing at which the slave latch 71 turns to a through state should be the same as the timing of when the input signal becomes valid at the input of slave latch 71 (earlier than CLK edge by td11).

Furthermore, the master latch control signal Cr2, at which the master latch 70 turns to a latched state, is delayed from the control signal Cr1 by a delay circuit 73. The delay circuit 73 should be set so that the latch timing is almost at the middle of the period in which the input signal a1 is valid (tv3). By setting the delay (td3) of delay circuit 73 to be half of the valid time of the external input signal (setup time+ hold time), maximum setup and hold margin is obtained without increasing the delay of the latch.

This embodiment shows that by setting the latch control of the slave latch 71 earlier than the latch control of the master latch, we can expect a fast acquisition of external data, which leads to fast semiconductor integrated circuits.

Embodiment 14

Figure 20:
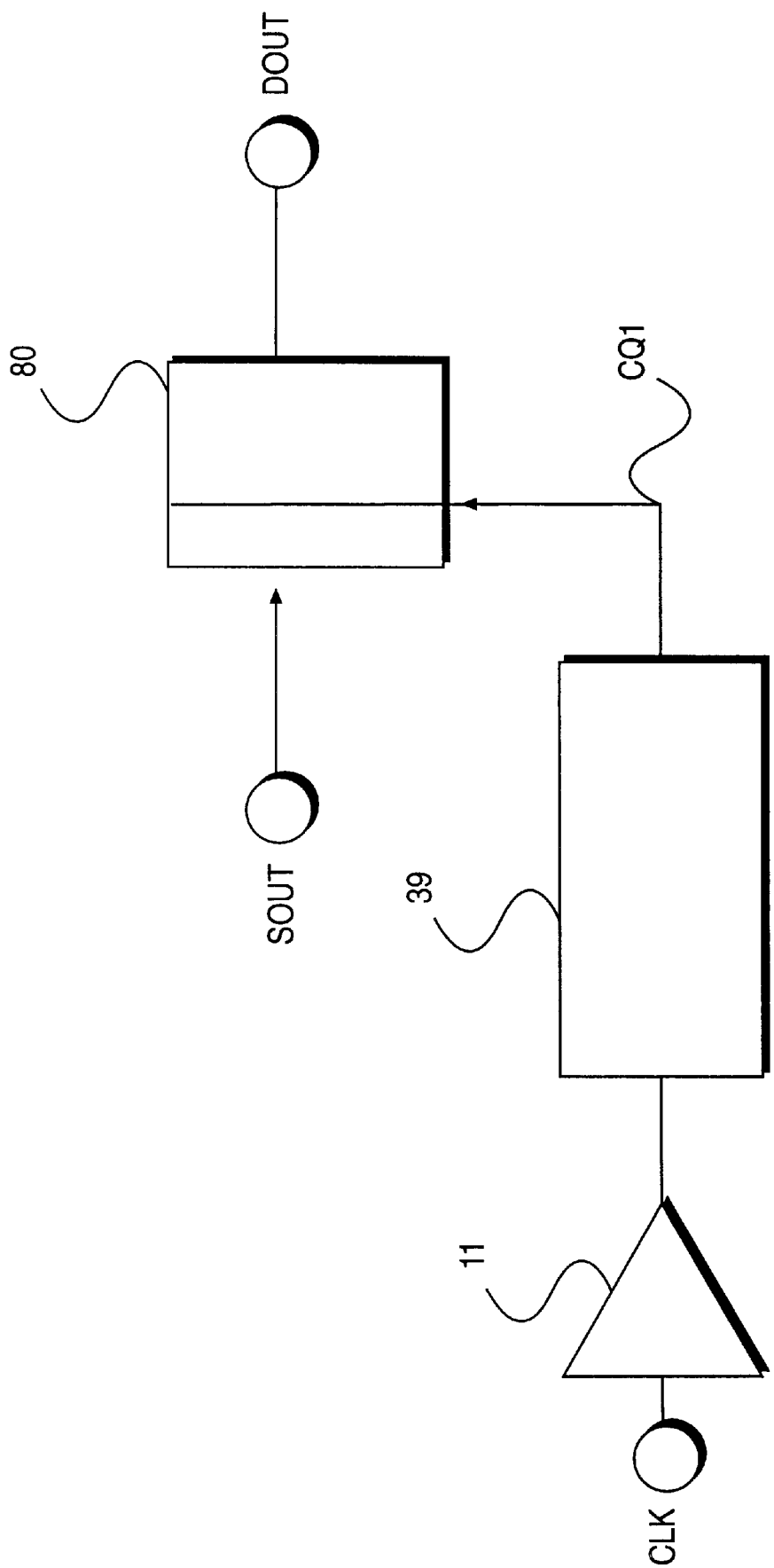
FIG. 20 is a block diagram of an embodiment of an output latch control means of the present invention.

FIG. 20 shows a block diagram of an embodiment of an output latch control means of the present invention. This embodiment is obtained by replacing the address input signal of the embodiment 1 with output data, and the operation thereof can be easily understood without further explanation. This embodiment makes it possible to easily control an output-data holding period by a pulse generation circuit, or the like.

Embodiment 15

Figure 21A:
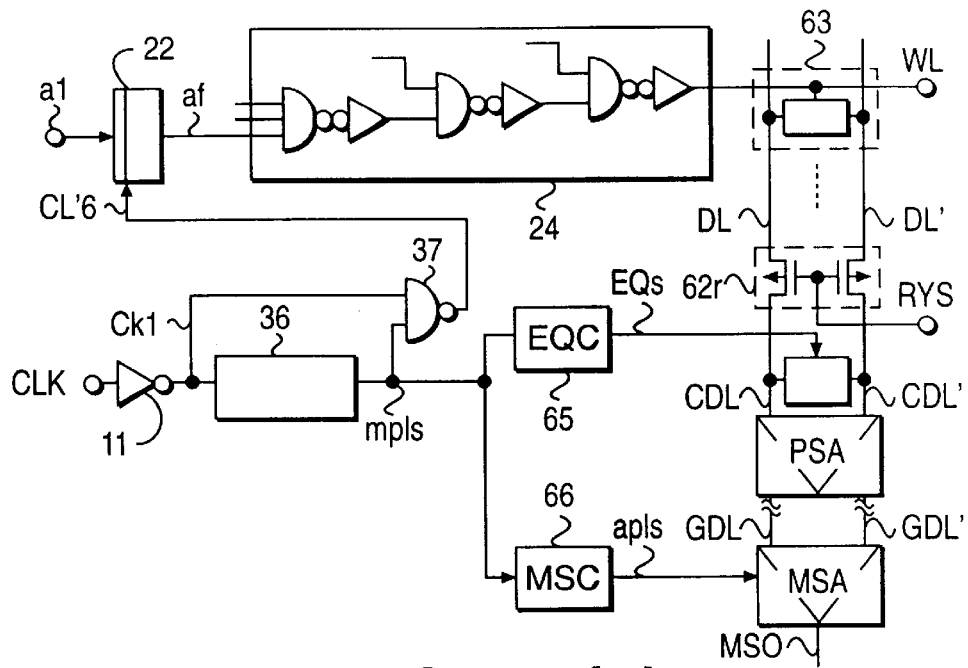
FIGS. 21(a) and 21(b) are a block diagram and a timing diagram of an embodiment of the output latch control means of the present invention.
Figure 21B:
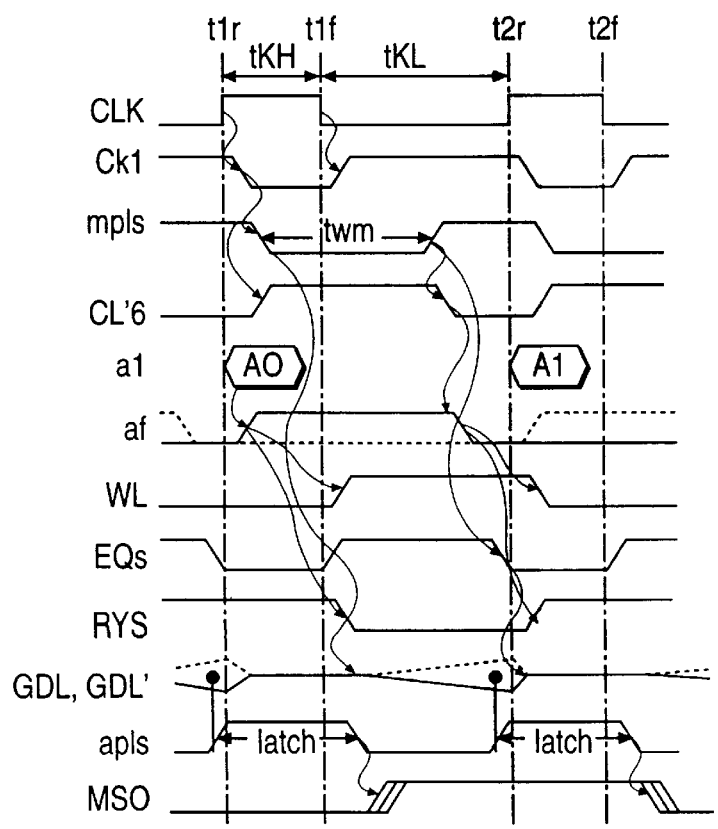

FIGS. 21(a) and 21(b) are a block diagram and a timing diagram showing an embodiment of a memory circuit whose read operation is interrelated with decoder output valid time. Symbol 11 denotes a clock buffer which inputs a clock signal CLK and outputs clock buffer output Ck1. Symbol 36 denotes a reference pulse generation circuit and outputs a reference pulse mpls. Symbol 37 is a NAND circuit, which inputs clock buffer output Ck1 and the output of the reference pulse generation circuit mpls, and performs a logical operation and outputs an output CL'6 which controls address input latch 22. Symbol af denotes an output of an address latch circuit which goes to decoder circuit 24. Symbol WL is a word line which is an output of decoder 24. Symbol 63 is a memory cell which is selected by the word line WL, which output memory cell data to bit line pair DL and DL'. Symbol 62r is a read column select switch which is controlled by read column selection signal RYS. Symbol 65 is an equalize control circuit (EQC) which controls the equalization means of CDL and CDL'. Symbol 66 is a main sense amplifier circuit (MSC) which controls the latch timing of a main sense amplifier circuit (MSA).

FIG. 21(b) shows an example of an operation timing diagram. From Ck1 which is from the clock buffer 11, reference pulse generation circuit 36 generates a reference pulse mpls whose width is twm. Latch control clock CL'6 is "Lo" during both Ck1 and mpls are "Hi". CL'6 turns the address latch 22 to latch state in response to the falling edge of Ck1, and turns it to through state in response to the rising edge of mpls. Decoder input af becomes valid in response to the valid address input signal a1 after the delay of the address latch circuit 22, and it is held until the latch control falling edge of CL'6. Word line WL becomes valid in response to the rising edge of the decoder input signal af, and becomes valid after the delay time of the decoder. The word line becomes invalid in response to the decoder input signal af becomes invalid, and after the fastest decoder delay time. Like this, we can make the valid word pulse width to be longer than twm, which is the pulse width of mpls, even though tKH of the external clock CLK is smaller than twm.

The read operation from memory cells works as follows. Reference pulse mpls controls the equalize means (EQ) through equalize control circuit (EQC). Equalize means releases the equalize in response to the word line WL or read column switch RYS becomes selected, and data from the memory cell 63 becomes available. Equalize means equalizes in response to memory cell 63 becoming unselected. Main sense amplifier control (MSC) controls latch timing of the main sense amplifier (MSA) so that the data from the memory cell which is amplified by the pre-sense amplifier (PSA) and appears as a voltage between data path GDL and GDL', can be latched in the main sense amplifier (MSA).

According to this embodiment, latch operation of the main sense amplifier can be controlled in response to the address valid time, and a stable read operation is obtained regardless of the clock pulse width.

Embodiment 16

Figure 22A:
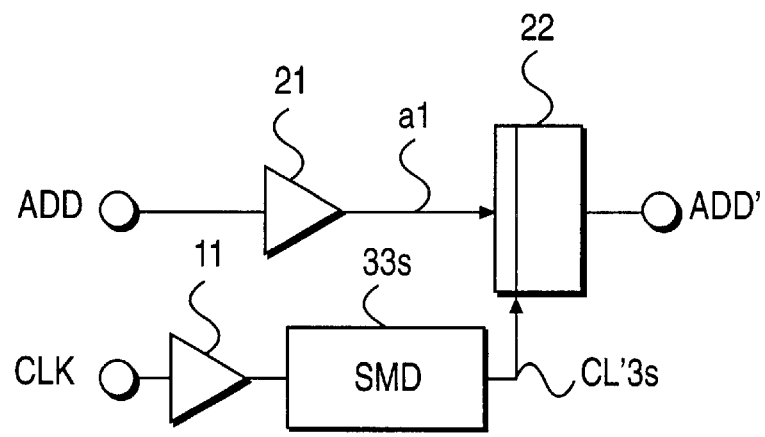
FIGS. 22(a) and 22(b) are a block diagram and a timing diagram of an input/output circuit including a synchronous mirror-delay as a pulse generating circuit.
Figure 22B:
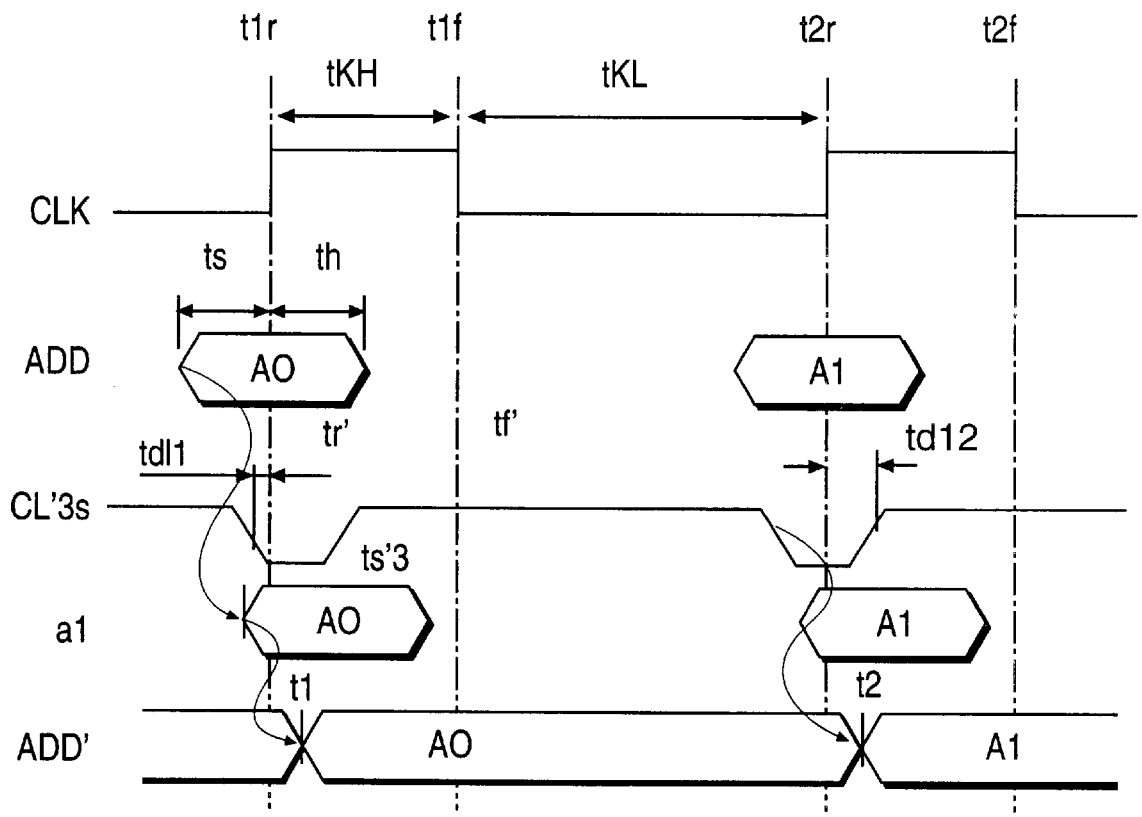

FIG. 22 shows a block diagram of the I/O control circuit including a Synchronous-Mirror-Delay (SMD) as a pulse generation circuit. An external clock signal (CLK) is received by the SMD 33s and they in turn generate internal clock signals CL'3's based on the external clock signal (CLK). Just like the DLL, SMD generates an internal clock having a determined phase shift from the external clock signal. Therefore, the SMD can control the address latch 22 to a "through" state synchronized with the set-up timing of the address input signal (a1) of the address latch 22. Also, the SMD can control the address latch 22 to a "latch" state at the timing when the address input signal (a1) is stabilized. Then, this system can control the latch regardless of the length of tKH of the external clock signal CLK. The control clock signals CL'3s which are output by SMD 33s, control the address latch 22 to a "through" state at the timing of the falling edge, and control the address latch 22 to a "latch" state at the timing of the rising edge. If timing td11 which controls the latch circuit to a "through" state, is the same as the timing of the set up timing ts'3 of the address latch circuit, the output of the address latch (22) will be stabilized and operated at high speed.

Figure 23A:
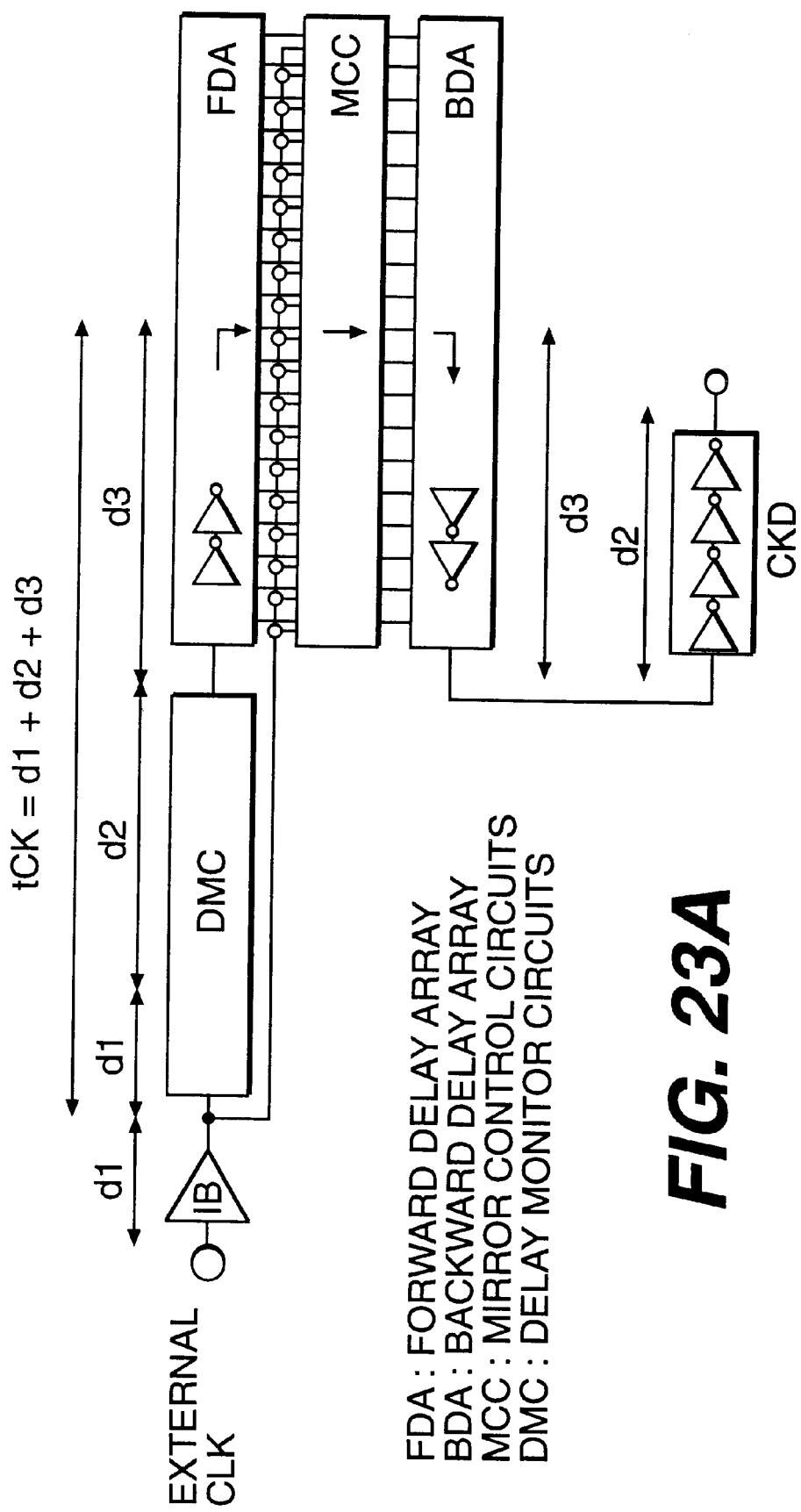
FIGS. 23(a) and 23(b) illustrate a block diagram and a timing diagram of a synchronous mirror-delay.
Figure 23B:
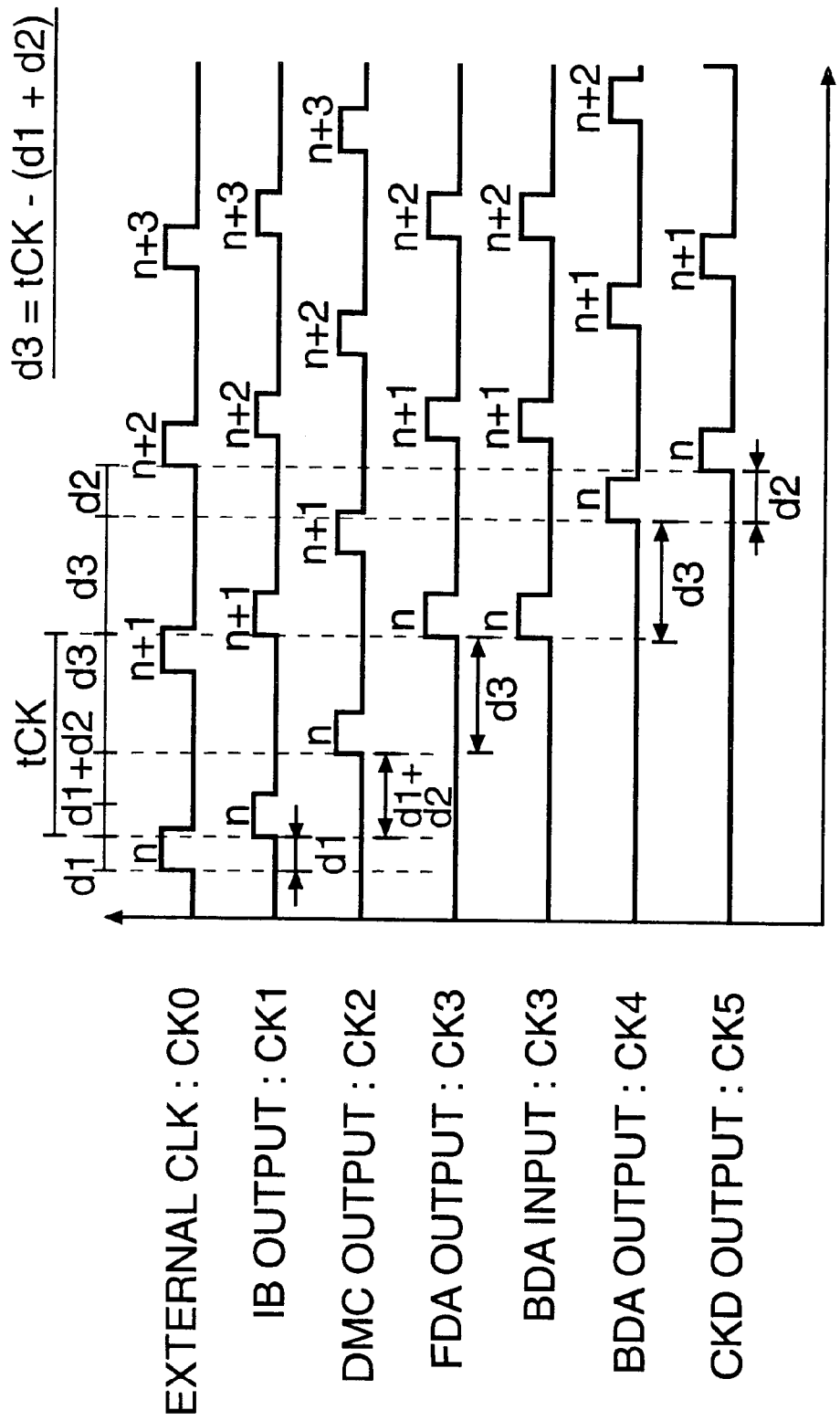

FIGS. 23(a) and 23(b) show a block diagram and a timing chart of an SMD as disclosed in FIG. 5 of and article by Saeki et al. in ISSCC96/SESSION 23/DRAM/PAPER SP 23.4, entitled "A 2.5 ns Clock Access 250 MHz 256 Mb SDRAM with a Synchronous Mirror Delay". The SMD includes an input buffer circuit (IB), delay monitor circuit (DMC), forward delay array (FDA), backward delay array (BDA), Mirror control circuit (MCC), and clock driver circuit (CKD). The input buffer circuit (IB) receives the external clock signal (CK0) and outputs the clock signal (CK1) which has delay time "d1" with respect to the external clock signal (CK0). The clock signal (CK1) is inputted into the delay monitor circuit (DMC) and Mirror control circuit (MCC). Delay monitor circuit (DMC) includes a series of input buffer circuits (IB) and the clock driver circuit (CKD). Delay monitor circuit (DMC) outputs a clock signal (CK2) to the forward delay array (FDA). The clock signal (CK2) is delayed by "d1+d2" where "d1" is the delay time of input buffer circuit (IB) and "d2" is the delay time of clock driver circuit (CKD). Each of the forward delay array (FDA) and backward delay array (BDA) include a plurality of delay stages. A mirror control circuit (MCC) compares the clock signals at each delay stage of the forward delay array and the output clock signal (CK1) of the input buffer circuit (IB), so as to detect the clock signal (CK3) that has one cycle delayed with respect to the clock signal (CK1). In the forward delay array (FDA), the output clock signal (CK3) from the "m" delay stage which corresponds to the delay time "tCK−(d1+d2)", coincides with clock signal (CK1), wherein "tCK" is a clock cycle time. Then the clock signal (CK3) is input into the "m" delay stage of the backward delay array (BDA). Clock signal (CK4), having delay time tCK−(d1+d2)" given by the backward delay array (BDA), is input into the clock driver circuit (CKD), and further delayed by "d2", which is the delay time of the clock circuit driver (CKD), and then served to the predetermined internal block. Therefore, the output CK5 of the clock driver circuit (CKD) is used as the internal clock signal, and the internal clock signal is just 2 cycles delayed to the external clock signal (CK0).

The output clock of the clock driver circuit is synchronized with the external clock signal. But, it is possible to generate a clock signal having an earlier timing to the rising edge of the clock signal, by using the output from the stage before the output (last) stage.

According to this embodiment, it is possible to control the latch circuit "through" based on the set up timing of the input/output signals. Therefore, it is possible to latch a signal faster without holding an unstable signal in the latch circuit at any cycle and period tKH of external clock signal. Also, the output address signal is stable if the address signal is switched, by controlling the "through" timing of the latch timing.

As described above, the embodiments of the present invention make it possible to optionally control an input or output holding period independently of the pulse width of an external clock signal. Therefore, it is possible to hold a signal only for a period necessary to hold an output signal and obtain a semiconductor device capable of performing stable operations at a high speed.

Moreover, by obtaining a logical sum between an external clock signal and a one-shot pulse signal generated from the leading edge of the external clock signal and thereby generating a holding-period control signal, it is possible to lengthen a signal holding period in accordance with the one-shot pulse signal even if the pulse width of the external clock signal is shortened and prevent erroneous operations.

Furthermore, by using a one-shot pulse signal generated from the leading edge of an external clock as a holding-period control signal, it is possible to obtain a control signal that is not subjected to the pulse width of an external clock signal.

Furthermore, by using a PLL as a holding-period control signal generation circuit, it is possible to control a latching period at a duty ratio to an operation cycle time.

Furthermore, by using a DLL as a holding-period control signal generation circuit, it is possible to set a latching period to a period between the timing to the leading edge of an external clock signal and the timing to the leading edge of the next cycle.

Furthermore, by using means for adjusting a holding-period control signal by a program circuit or fuse circuit, it is possible to adjust a latching period after completing a chip.

Furthermore, by using a delay circuit comprising a current switch of an ECL or a gate delay circuit to be driven by a constant current as a component of a holding-period control signal generation circuit, it is possible to control the dispersion between holding-period control signals.

Furthermore, by controlling signal holding means by the leading edge of an external clock signal and constituting the signal holding means with two stages of a master latch and a slave latch to make the control timing of the slave latch 10% of an operation cycle or earlier than the control timing of the master latch, it is possible to further accelerate the capture of a signal into the signal holding means.

Furthermore, by providing a system incorporating the above-described semiconductor device, it is possible to realize a high-speed system.

As described above, the present invention makes it possible to accelerate the capture of a signal and hold the signal only for a desired period without depending on the duty ratio of an external clock. Therefore, it is possible to provide a semiconductor device and a computer system capable of normally operating even if an operation cycle is accelerated.

While the present invention has been described above in connection with the preferred embodiments, one of ordinary skill in the art would be enabled by this disclosure to make various modifications to these embodiments and still be within the scope and spirit of the present invention as defined in the appended claims.

What is claimed is:

1. A semiconductor device, operating synchronously with an external clock signal and having means for holding a signal input from an external unit, and comprising a holding-period control signal generation circuit for generating a holding-period control signal for controlling an input-signal holding period independently of a pulse width of an external clock signal, and both of a start timing and an end timing of said input signal holding period are determined by one of a rising portion and a falling portion of said external clock signal independently.

2. A semiconductor device, operating synchronously with an external clock signal and having means for holding a signal output from an internal unit, and comprising a holding-period control signal generation circuit for generating a holding-period control signal for controlling an output-signal holding period independently of a pulse width of an external clock signal, and a start timing and an end timing of said input signal holding period are determined by a same rising or falling portion of said external clock signal independently.

3. The semiconductor device according to claim 1, wherein the holding-period control signal is a signal that is a result of taking a logical sum of an external clock signal and a one-shot pulse signal generated from a leading edge of the external clock signal.

4. The semiconductor device according to claim 2, wherein the holding-period control signal is a signal that is a result of taking a logical sum of an external clock signal and a one-shot pulse signal generated from a leading edge of the external clock signal.

5. The semiconductor device according to claim 1, wherein the holding-period control signal is a one-shot pulse signal generated from the leading edge of an external clock signal.

6. The semiconductor device according to claim 2, wherein the holding-period control signal is a one-shot pulse signal generated from the leading edge of an external clock signal.

7. The semiconductor device according to claim 1, wherein the holding-period control signal is a signal generated from a phase-locked loop (PLL).

8. The semiconductor device according to claim 1, wherein the holding-period control signal is a signal generated from a delay-locked loop (DLL).

9. The semiconductor device according to claim 1, wherein the holding period can be selected by a program circuit or fuse circuit.

10. The semiconductor device according to claim 1, wherein a delay circuit having a current switch of an ECL is included as at least one component of the holding-period control signal generation circuit.

11. The semiconductor device according to claim 1, wherein the holding-period control signal generation circuit includes a delay circuit having a gate circuit driven by a constant current as at least one of its components.

12. A semiconductor device operating synchronously with an external clock signal and having means for holding a signal input from an external unit, wherein the means for holding a signal input from an external unit includes a two-stage holding means of a master latch and a slave latch and a control timing of the slave latch occurs at least 10% of an operation cycle time earlier than a control timing of the master latch.

13. A semiconductor device according to claim 12, further comprising:

a delay locked loop which receives an external clock signal and outputs the control timing of the slave latch; and a delay circuit connected between the delay locked loop and the master latch, the delay circuit providing a delay amount that is selected so that the control timing of the master latch is approximately centered in a period in which the signal input from an external unit is valid.

14. A synchronous random access memory (SRAM) device for capturing an external signal in an accelerated fashion and for holding the external signal for a time sufficient to accurately carry out a read/write process using the external signal, the SRAM device comprising:

a first terminal for receiving the external signal;

latch means for capturing the external signal;

a second terminal for receiving a clock signal having a duty cycle; and means for modifying the clock signal and applying the modified clock signal to the latch means;

wherein a timing of a rising (or falling) edge of said modified clock signal is determined by a timing of a rising (or falling) edge of said clock signal, a timing of a falling (or rising) edge of said modified clock signal is determined by a timing of a rising (or falling) edge of said clock signal, and wherein the latch means is controlled by the modified clock signal so that the external signal is held by the latch means for a predetermined period of time independent of the duty cycle of the clock signal.

15. The SRAM device according to claim 14, wherein the external signal is an address signal.

16. The SRAM device according to claim 14, wherein the means for modifying the clock signal includes a pulse generation circuit.

17. The SRAM device according to claim 14, wherein the means for modifying the clock signal includes a phase locked loop.

18. The SRAM device according to claim 14, wherein the means for modifying the clock signal includes a delay locked loop.

19. The SRAM device according to claim 14, wherein the means for modifying the clock signal includes a synchronous mirror delay.

20. A circuit comprising:

a latch which receives an input signal; and a pulse generation circuit which receives a clock signal and outputs a modified clock signal to the latch, and;

wherein a timing of a rising (or falling) edge of said modified clock signal is determined by a timing of a rising (or falling) edge of said clock signal, a timing of a falling (or rising) edge of said modified clock signal is determined by a timing of a rising (or falling) edge of said clock signal, and wherein the latch holds the input signal for a predetermined period of time as determined by the modified clock signal independent of a pulse width of the clock signal.

21. A circuit for use in conjunction with a synchronous random access memory device comprising:

a latch which receives an input signal; and a pulse generation circuit which receives a clock signal and outputs a modified clock signal to the latch, wherein the latch holds the input signal for a predetermined period of time as determined by the modified clock signal and responsive only to rising edges of the clock signal.

22. The circuit according to claim 21, wherein the input signal is a delayed address signal.

23. The circuit according to claim 21, wherein the predetermined period of time corresponds to a time period necessary to accurately carry out a read/write operation using the input signal.

24. A circuit for use in conjunction with a synchronous random access memory device comprising:

a latch which receives an input signal; and a phase locked loop circuit which receives a clock signal and outputs a modified clock signal to the latch, wherein the latch holds the input signal for a predetermined period of time as determined by the modified clock signal and responsive only to rising edges of the clock signal.

25. The circuit according to claim 24, wherein the input signal is a delayed address signal.

26. The circuit according to claim 24, wherein the predetermined period of time corresponds to a time period necessary to accurately carry out a read/write operation using the input signal.

27. A circuit for use in conjunction with a synchronous random access memory device comprising:

a latch which receives an input signal; and a delay locked loop circuit which receives a clock signal and outputs a modified clock signal to the latch, wherein the latch holds the input signal for a predetermined period of time as determined by the modified clock signal and responsive only to rising edges of the clock signal.

28. The circuit according to claim 27, wherein the input signal is a delayed address signal.

29. The circuit according to claim 27, wherein the predetermined period of time corresponds to a time period necessary to accurately carry out a read/write operation using the input signal.

30. A computer system incorporating the semiconductor device of claim 1.

31. A computer system incorporating the semiconductor device of claim 12.

32. A computer system incorporating the SRAM of claim 14.

33. A computer system incorporating the circuit used in conjunction with a synchronous random access memory device of claim 20.

34. A semiconductor device operating synchronously with an external clock signal and having means for holding a signal input from an external unit, and comprising a holding-period control signal generation circuit for generating a holding-period control signal for controlling an input signal holding period independently of a pulse width of external clock signal, and wherein said input signal holding period starts at a first predetermined time after a predetermined rising or falling portion of said external clock signal, and said input signal holding period ends at a second predetermined time after said predetermined rising or falling portion of said external clock signal.

* * * * *